US012581934B2

(12) United States Patent
Ho et al.

(10) Patent No.: US 12,581,934 B2
(45) Date of Patent: Mar. 17, 2026

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Pokuan Ho, Taipei City (TW); Chia-Tien Wu, Taichung City (TW); Cheng-Chi Chuang, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 103 days.

(21) Appl. No.: 18/059,439

(22) Filed: Nov. 29, 2022

(65) Prior Publication Data

US 2023/0088037 A1     Mar. 23, 2023

Related U.S. Application Data

(62) Division of application No. 16/254,007, filed on Jan. 22, 2019, now abandoned.

(60) Provisional application No. 62/711,098, filed on Jul. 27, 2018.

(51) Int. Cl.
| *H01L 23/522* | (2006.01) |
| *H01L 21/768* | (2006.01) |
| *H01L 23/532* | (2006.01) |

(52) U.S. Cl.
CPC .... *H01L 23/5226* (2013.01); *H01L 21/76802* (2013.01); *H01L 21/76832* (2013.01); *H01L 21/76877* (2013.01); *H01L 23/53295* (2013.01)

(58) Field of Classification Search
CPC ........................................ H01L 21/768–76898
See application file for complete search history.

(56) References Cited

U.S. PATENT DOCUMENTS

| | | | | |
|---|---|---|---|---|
| 2006/0141772 | A1* | 6/2006 | Koh | .................. H01L 21/76873 |
| | | | | 257/E21.585 |
| 2010/0308463 | A1* | 12/2010 | Yu | ..................... H01L 21/02074 |
| | | | | 257/E23.141 |
| 2019/0164887 | A1* | 5/2019 | Wang | .................. H01L 23/5283 |
| 2019/0341298 | A1* | 11/2019 | Yang | .................. H01L 21/76883 |
| 2020/0066585 | A1* | 2/2020 | Lin | ................... H01L 21/76883 |
| 2020/0098688 | A1* | 3/2020 | Shi | .................... H01L 21/28568 |

* cited by examiner

*Primary Examiner* — Lauren R Bell
(74) *Attorney, Agent, or Firm* — WPAT LAW; Anthony King

(57) ABSTRACT

A semiconductor structure includes a first conductive member, a second conductive member and a third conductive member. The first conductive member is extended through and is laterally surrounded by a first dielectric layer. The second conductive member is disposed over the first dielectric layer and the first conductive member, and is laterally surrounded by a second dielectric layer. The third conductive member is disposed over the second conductive member, and is laterally surrounded by the second dielectric layer, wherein a portion of the second conductive member is protruded into the third conductive member.

20 Claims, 20 Drawing Sheets

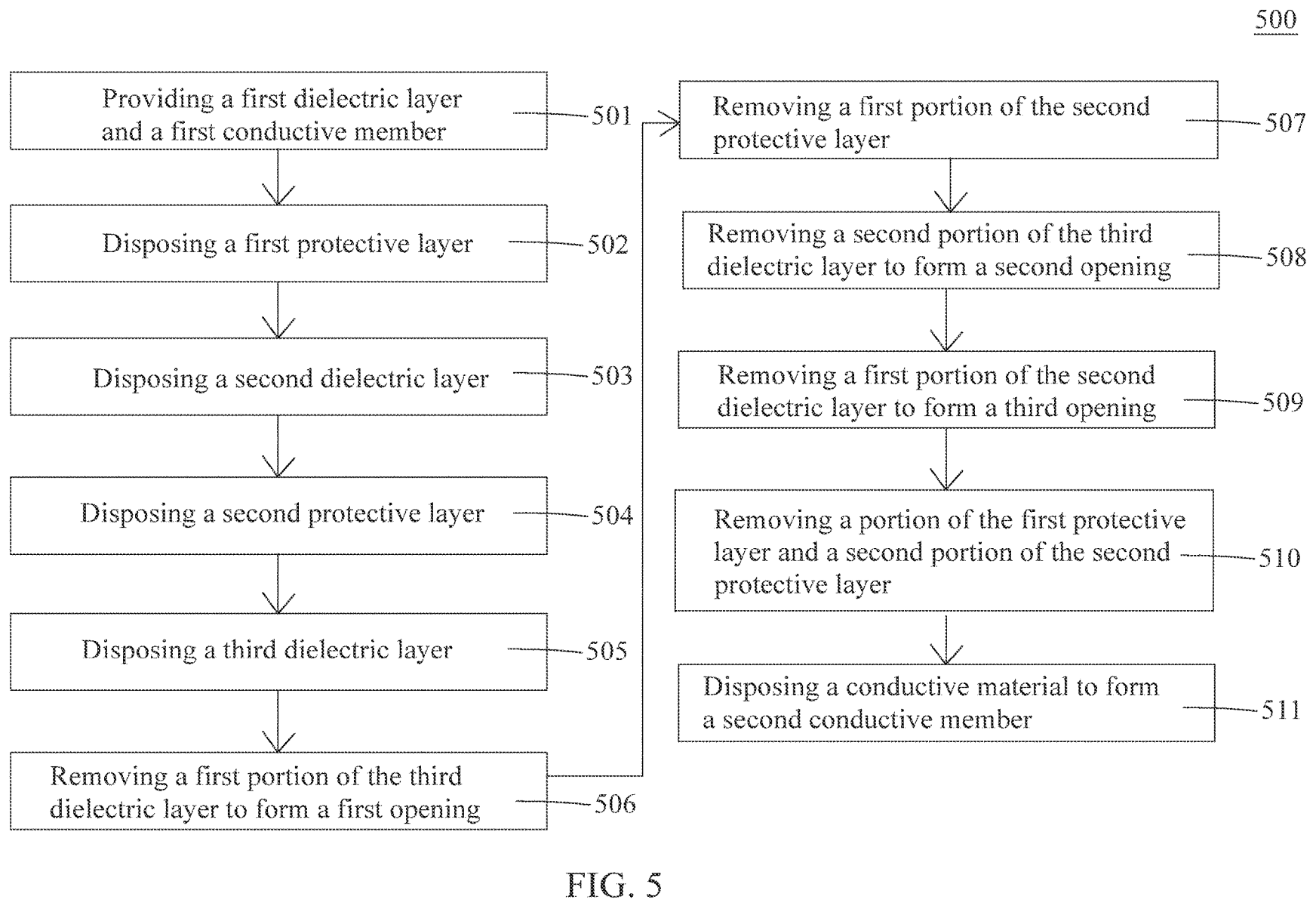

500

Providing a first dielectric layer and a first conductive member — 501

Disposing a first protective layer — 502

Disposing a second dielectric layer — 503

Disposing a second protective layer — 504

Disposing a third dielectric layer — 505

Removing a first portion of the third dielectric layer to form a first opening — 506

Removing a first portion of the second protective layer — 507

Removing a second portion of the third dielectric layer to form a second opening — 508

Removing a first portion of the second dielectric layer to form a third opening — 509

Removing a portion of the first protective layer and a second portion of the second protective layer — 510

Disposing a conductive material to form a second conductive member — 511

FIG. 5

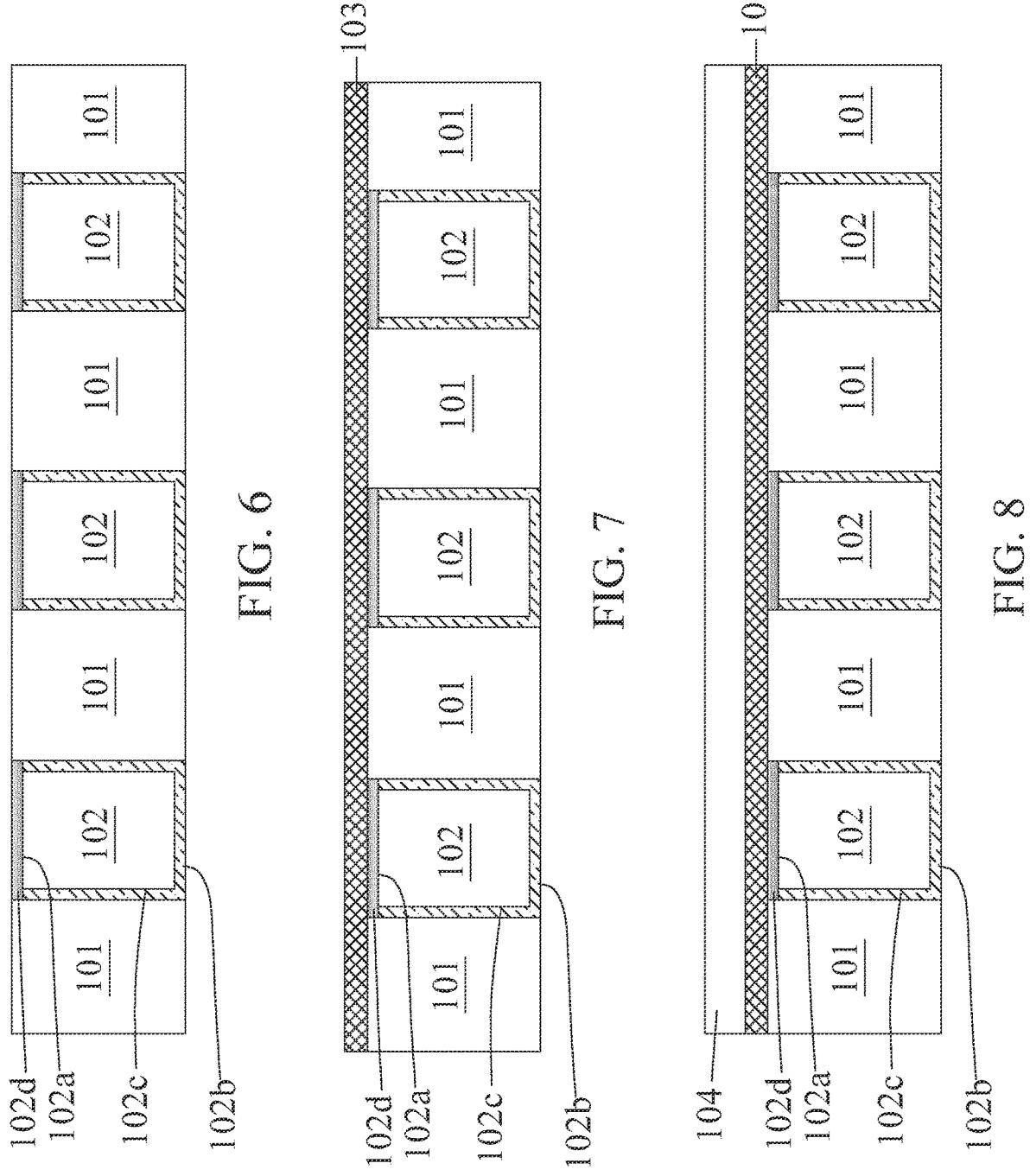

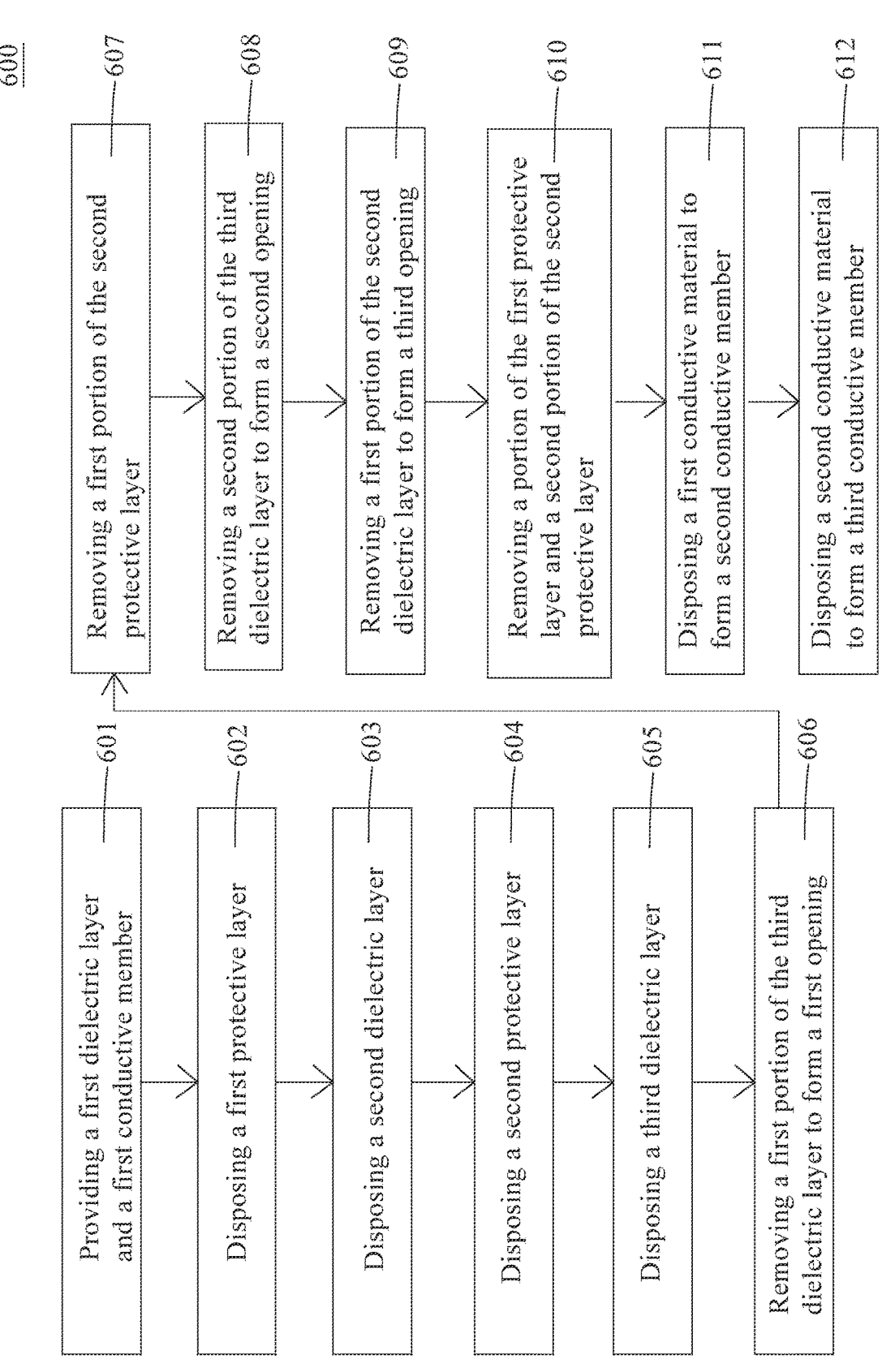

600

601 Providing a first dielectric layer and a first conductive member

602 Disposing a first protective layer

603 Disposing a second dielectric layer

604 Disposing a second protective layer

605 Disposing a third dielectric layer

606 Removing a first portion of the third dielectric layer to form a first opening 607 Removing a first portion of the second protective layer 608 Removing a second portion of the third dielectric layer to form a second opening 609 Removing a first portion of the second dielectric layer to form a third opening 610 Removing a portion of the first protective layer and a second portion of the second protective layer 611 Disposing a first conductive material to form a second conductive member 612 Disposing a second conductive material to form a third conductive member

FIG. 20

SEMICONDUCTOR STRUCTURE AND MANUFACTURING METHOD THEREOF

PRIORITY CLAIM AND CROSS-REFERENCE

This application is a divisional application of U.S. patent application Ser. No. 16/254,007 filed on Jan. 22, 2019, entitled of "SEMICONDUCTOR STRUCTURE AND MANUFACTURING METHOD THEREOF", which claims the benefit of a provisional application Ser. 62/711, 098 filed on Jul. 27, 2018, entitled "SEMICONDUCTOR STRUCTURE AND MANUFACTURING METHOD THEREOF," the entire contents of all of which are hereby incorporated by reference.

BACKGROUND

Electronic equipments using semiconductor devices are essential for many modern applications. With the advancement of electronic technology, the semiconductor devices are becoming small in size while having many complicated integrated circuitries. Due to the miniaturized scale of the semiconductor device, many semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, misalignment of components or other issues, resulting in a high yield loss of the semiconductor device. The semiconductor device is produced in an undesired configuration, which would further exacerbate materials wastage and thus increase the manufacturing cost.

Since more different small components are involved, a complexity of the manufacturing operations of the semiconductor device is increased. As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5 is a flow diagram of a method of manufacturing a semiconductor structure in accordance with some embodiments of the present disclosure.

FIGS. 6-19 are schematic views of manufacturing a semiconductor structure by a method of FIG. 5 in accordance with some embodiments of the present disclosure.

FIG. 20 is a flow diagram of a method of manufacturing a semiconductor structure in accordance with some embodiments of the present disclosure.

FIGS. 6-17 and 21-23 are schematic views of manufacturing a semiconductor structure by a method of FIG. 20 in accordance with some embodiments of the present disclosure.

DETAILED DESCRIPTION OF THE DISCLOSURE

Figure 1:
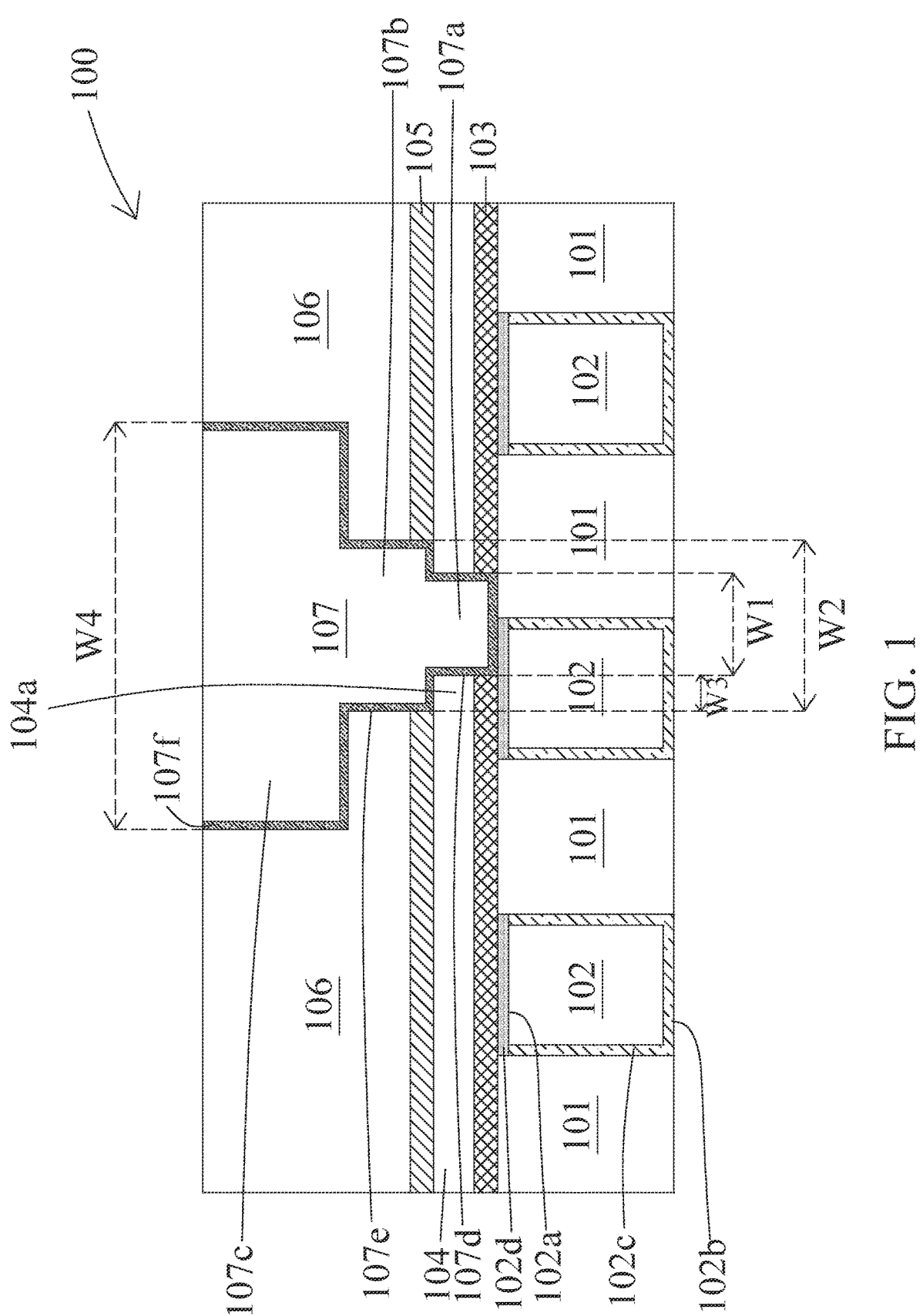
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure is involved in a semiconductor structure. The interconnect structure includes several conductive vias extended through one or more layers of the semiconductor structure and connected with conductive lines extended over one of layers of the semiconductor structure. The conductive vias extended through different layers and connects the conductive lines at different layers of the semiconductor structure. However, an overall size of the semiconductor structure becomes smaller and smaller. As such, an overlay issue may occur between two conductive vias disposed over each other. The conductive vias may not be disposed accurately and thus may not vertically align with each other. Further, a space between neighboring conductive vias also becomes smaller and smaller. Therefore, the neighboring conductive vias at the same layer may be easily bridged by the conductive via disposed at the above layer, which leads to failure of electrical connection. As a result, reliability of the semiconductor structure would be adversely affected.

In the present disclosure, a semiconductor structure is disclosed. The semiconductor structure includes a first conductive member surrounded by a first dielectric layer, and a second conductive member disposed over the first conductive member and surrounded by a second dielectric layer and a third dielectric layer. The second conductive member includes a first portion and a second portion disposed over and coupled with the first portion. The first portion is extended through and surrounded by the second dielectric layer, and the second portion is surrounded by the third dielectric layer.

A contour of the second conductive member with a step is formed by the first portion and the second portion of the second conductive member. A width of the first portion is substantially less than a width of the second portion. The second conductive member with the step contour can increase a clearance between the second conductive member and a conductive member neigbouring with the first conductive member. Therefore, undesirable contact with the conductive member neigbouring with the first conductive member can be prevented.

Further, a method of manufacturing a semiconductor structure is disclosed. The method includes providing a first dielectric layer and a first conductive member surrounded by the first dielectric layer; disposing a first protective layer over the first dielectric layer and the first conductive member; disposing a second dielectric layer over the first protective layer; disposing a second protective layer over the second dielectric layer; disposing a third dielectric layer over the second protective layer; removing a portion of the second dielectric layer; removing a portion of the third dielectric layer; and disposing a conductive material to form a second conductive member. The second conductive member includes a first portion surrounded by the second dielectric layer and a second portion surrounded by the third dielectric layer.

A width of the first portion is substantially less than a width of the second portion. As such, a step contour of the second dielectric layer and the third dielectric layer is formed by the removal of the portion of the second dielectric layer and the portion of the third dielectric layer. As a result, a clearance between the second conductive member and a conductive member neigbouring with the first conductive member can be increased.

FIG. 1 is a schematic cross sectional view of a semiconductor structure 100 in accordance with various embodiments of the present disclosure. In some embodiments, the semiconductor structure 100 includes a first dielectric layer 101, a first conductive member 102, a first protective layer 103, a second dielectric layer 104, a second protective layer 105, a third dielectric layer 106 and a second conductive member 107. In some embodiments, the semiconductor structure 100 is a part of a wafer, a die or a package. In some embodiments, the semiconductor structure 100 is configured to connect with another semiconductor structure such as a die, a package, a printed circuit board (PCB) or the like.

In some embodiments, the semiconductor structure 100 includes a substrate under the first dielectric layer 101 and the first conductive member 101. In some embodiments, the substrate includes semiconductive materials such as silicon or other suitable materials. In some embodiments, the substrate is a silicon substrate or silicon wafer.

In some embodiments, the first dielectric layer 101 surrounds the first conductive member 102. In some embodiments, the first dielectric layer 101 includes a low dielectric constant (k) material such as silicon oxide (SiO), porous organosilicate (SiOCH), borophosphosilicate glass (BPSG), phosphosilicate glass (PSG) or the like.

In some embodiments, the first conductive member 102 is extended through and surrounded by the first dielectric layer 101. In some embodiments, the first conductive member 102 includes a first surface 102a and a second surface 102b opposite to the first surface 102a. In some embodiments, the first conductive member 102 is extended between the first surface 102a and the second surface 102b. In some embodiments, the first conductive member 102 includes conductive material such as copper (Cu), aluminum (Al), cobalt (Co), titanium (Ti), tungsten (W), ruthenium (Ru), molybdenum (Mo), iridium (Jr), rhodium (Rh) or the like.

In some embodiments, the second surface 102b of the first conductive member 102 is exposed. In some embodiments, the second surface 102b is configured to receive a conductive line or a conductive structure to connect a circuitry of the semiconductor structure 100 with a circuitry of another semiconductor structure. In some embodiments, a height of the first conductive member 102 is substantially the same as a thickness of the first dielectric layer 101. In some embodiments, the height of the first conductive member 102 and the thickness of the first dielectric layer 101 are respectively about 50 Å to about 500 Å.

In some embodiments, a first barrier layer 102c surrounds the first conductive member 102. In some embodiments, the first barrier layer 102c is a diffusion barrier layer. In some embodiments, the first barrier layer 102c is configured to prevent diffusion from the first conductive member 102 to the first dielectric layer 101 and provide adhesion between the first conductive member 102 and the first dielectric layer 101. In some embodiments, the first barrier layer 102c is disposed between the first conductive member 102 and the first dielectric layer 101. In some embodiments, the first barrier layer 102c includes tungsten (W), titanium (Ti), aluminum (Al), copper (Cu), tantalum (Ta) or the like.

In some embodiments, a capping layer 102d is disposed over the first conductive member 102. In some embodiments, the capping layer 102d is disposed over the first surface 102a of the first conductive member 102. In some embodiments, the capping layer 102d is surrounded by the first dielectric layer 101. In some embodiments, the capping layer 102d is disposed over the first barrier layer 102c. In some embodiments, the capping layer 102d includes cobalt (Co), tantalum (Ta), tungsten (W), platinum (Pt) or the like.

In some embodiments, the first protective layer 103 is disposed over the first dielectric layer 101 and the first conductive member 102. In some embodiments, the first protective layer 103 is in contact with the first dielectric layer 101. In some embodiments, the first protective layer 103 is disposed over and in contact with the capping layer 102d. In some embodiments, the first protective layer 103 is an etch stop layer configured to stop etching operations. In some embodiments, the first protective layer 103 includes nitride. In some embodiments, the first protective layer 103 includes dielectric material such as silicon nitride (SiN), silicon oxide (SiO), aluminum oxynitride (AlON), silicon carbon nitride (SiCN) or the like.

In some embodiments, the second dielectric layer 104 is disposed over the first protective layer 103. In some embodiments, the second dielectric layer 104 is disposed over the first dielectric layer 101 and the first conductive member 102. In some embodiments, the second dielectric layer 104 includes material same as or different from the first dielectric layer 101. In some embodiments, the first dielectric layer 101 includes a low dielectric constant (k) material such as silicon oxide (SiO), porous organosilicate (SiOCH), borophosphosilicate glass (BPSG), phosphosilicate glass (PSG) or the like.

In some embodiments, the second protective layer 105 is disposed over the second dielectric layer 104. In some embodiments, the second protective layer 105 is disposed over the first protective layer 103, the first conductive member 102 and the first dielectric layer 101. In some embodiments, the second protective layer 105 is an etch stop layer configured to stop etching operations. In some embodiments, the second protective layer 106 includes material same as or different from the first protective layer 103. In some embodiments, the second protective layer 105 includes nitride. In some embodiments, the second protective layer 105 includes dielectric material such as silicon nitride (SiN), silicon oxide (SiO), aluminum oxynitride (AlON), silicon carbon nitride (SiCN) or the like.

In some embodiments, the third dielectric layer 106 is disposed over the second dielectric layer 104. In some embodiments, the third dielectric layer 106 is disposed over the second protective layer 105, the first protective layer 103, the first conductive member 102 and the first dielectric layer 101. In some embodiments, the second protective layer 105 is disposed between the second dielectric layer 104 and the third dielectric layer 106. In some embodiments, the third dielectric layer 106 surrounds the second conductive member 107. In some embodiments, the third dielectric layer 106 includes material same as or different from the first dielectric layer 101 and the second dielectric layer 104. In some embodiments, the third dielectric layer 106 includes a low dielectric constant (k) material such as silicon oxide (SiO), porous organosilicate (SiOCH), borophosphosilicate glass (BPSG), phosphosilicate glass (PSG) or the like.

In some embodiments, the second conductive member 107 is disposed over the first dielectric layer 101 and the first conductive member 102. In some embodiments, the second conductive member 107 is extended through and surrounded by the third dielectric layer 106, the second protective layer 105, the second dielectric layer 104 and the first protective layer 103. In some embodiments, the second conductive member 107 includes conductive material such as copper (Cu), aluminum (Al), cobalt (Co), titanium (Ti), tungsten (W), ruthenium (Ru), molybdenum (Mo), iridium (Jr), rhodium (Rh) or the like.

In some embodiments, the second conductive member 107 includes a first portion 107a and a second portion 107b. In some embodiments, the first portion 107a is extended through and surrounded by the first protective layer 103 and the second dielectric layer 104. In some embodiments, the first portion 107 is disposed over the first conductive member 102 and the first dielectric layer 101. In some embodiments, the first portion 107a covers a portion of the first conductive member 102 and a portion of the first dielectric layer 101.

In some embodiments, the second portion 107b is disposed over and coupled with the first portion 107a. In some embodiments, the second portion 107b is surrounded by the third dielectric layer 106 and the second dielectric layer 105. In some embodiments, a first width W1 of the first portion 107a of the second conductive member 107 is substantially less than a second width W2 of the second portion 107b of the second conductive member 107. In some embodiments, the first width W1 is about 10 Å to about 300 Å. In some embodiments, the second width W2 is about 16 Å to about 600 Å.

In some embodiments, at least a portion of the second portion 107b of the second conductive member 107 is protruded from the first portion 107a of the second conductive member 107. In some embodiments, the portion of the second portion 107b is protruded from the first portion 107a in a third width W3 of about 3 Å to about 150 Å. In some embodiments, at least a portion 104a of the second dielectric layer 104 is disposed between the first protective layer 103 and the second portion 107b of the second conductive member 107. In some embodiments, the portion 104a of the second dielectric layer 104 is protruded into the second conductive member 107. In some embodiments, an outer surface of the first portion 107a and the second portion 107b includes a step contour.

In some embodiments, the first portion 107a includes a third surface 107d interfacing with the first protective layer 103 and the second dielectric layer 104. In some embodiments, the second portion 107b includes a fourth surface 107e interfacing with the second protective layer 105 and the third dielectric layer 106. In some embodiments, the third surface 107d is substantially parallel to the fourth surface 107e. In some embodiments, the third surface 107d and the fourth surface 107e are substantially orthogonal to the first surface 102a of the first conductive member 102. In some embodiments, the third surface 107d and the fourth surface 107e are vertical surfaces. In some embodiments, the fourth surface 107e is protruded from the third surface 107d. In some embodiments, the fourth surface 107e is protruded from the third surface 107d in the third width W3.

In some embodiments, the second conductive member 107 includes a third portion 107c disposed above the second portion 107b and the first portion 107a. In some embodiments, the third portion 107c is coupled with the second portion 107b. In some embodiments, the third portion 107c is surrounded by the third dielectric layer 106. In some embodiments, a fourth width W4 of the third portion 107c is substantially greater than the first width W1 of the first portion 107a and the second width W2 of the second portion 107b.

In some embodiments, a second barrier layer 107f surrounds the second conductive member 107. In some embodiments, the second barrier layer 107f is a diffusion barrier layer. In some embodiments, the second barrier layer 107f is configured to prevent diffusion from the second conductive member 107 to the third dielectric layer 106 and the second dielectric layer 104, and provide adhesion between the second conductive member 107 and the third dielectric layer 106 and between the second conductive member 107 and the second dielectric layer 104. In some embodiments, the second barrier layer 107f is disposed between the second conductive member 107 and the third dielectric layer 106. In some embodiments, the second barrier layer 107f is disposed between the second conductive member 107 and the second dielectric layer 104. In some embodiments, the second barrier layer 107f is disposed between the second conductive member 107 and the first protective layer 103. In some embodiments, the second barrier layer 107f is disposed between the second conductive member 107 and the second protective layer 105. In some embodiments, the second barrier layer 107f includes tungsten (W), titanium (Ti), aluminum (Al), copper (Cu), tantalum (Ta) or the like.

In some embodiments, the first portion 107a of the second conductive member 107 is disposed above the first conductive member 102 and the first dielectric layer 101. In some embodiments as shown in FIG. 1, the second conductive member 107 is not vertically aligned with the first conductive member 102. In some embodiments, a central axis of the second conductive member 107 is deviated from a central axis of the first conductive member 102. In some embodiments, the first portion 107a of the second conductive member 107 is not vertically aligned with the first conductive member 102. In some embodiments, a central axis of the first portion 107a is deviated from the central axis of the first conductive member 102. In some embodiments, the first portion 107 is disposed above the first conductive member 102 and the first dielectric layer 101. In some embodiments, the first portion 107 covers or is in contact with a portion of the first dielectric layer 101.

Figure 2:
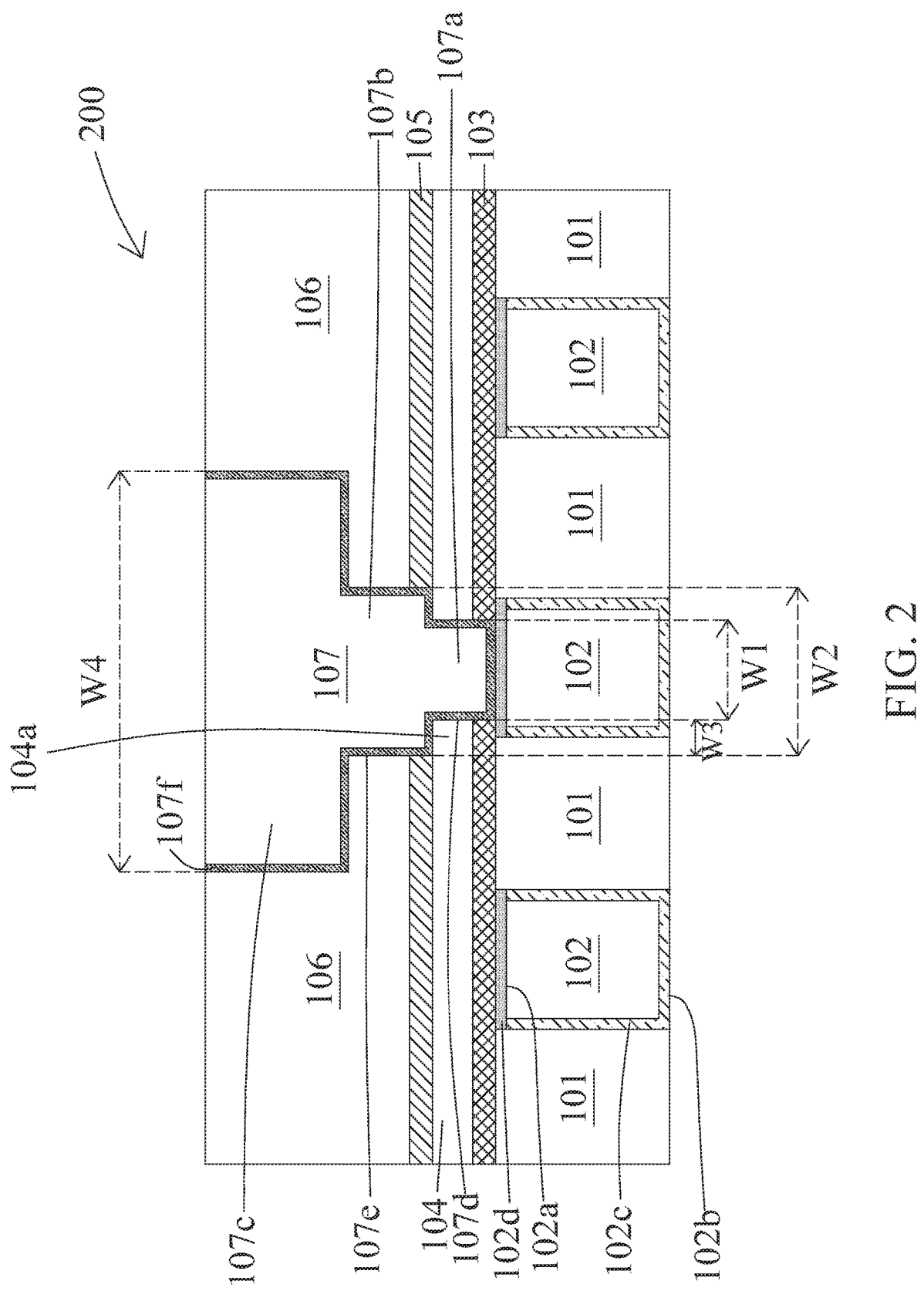
FIG. 2 is a schematic cross sectional view of a semiconductor structure in accordance with some embodiments of the present disclosure.

In some embodiments, the first portion 107a of the second conductive member 107 is disposed above the first conductive member 102. In some embodiments as shown in FIG. 2, the second conductive member 107 is vertically aligned with the first conductive member 102. In some embodiments, the central axis of the second conductive member 107 is overlapped and common with the central axis of the first conductive member 102. In some embodiments, the first portion 107a of the second conductive member 107 is vertically aligned with the first conductive member 102. In some embodiments, the central axis of the first portion 107a is overlapped and common with the central axis of the first conductive member 102. In some embodiments, the first portion 107 is disposed above the first conductive member 102. In some embodiments, the first portion 107 does not cover and is not in contact with the first dielectric layer 101.

Figure 3:
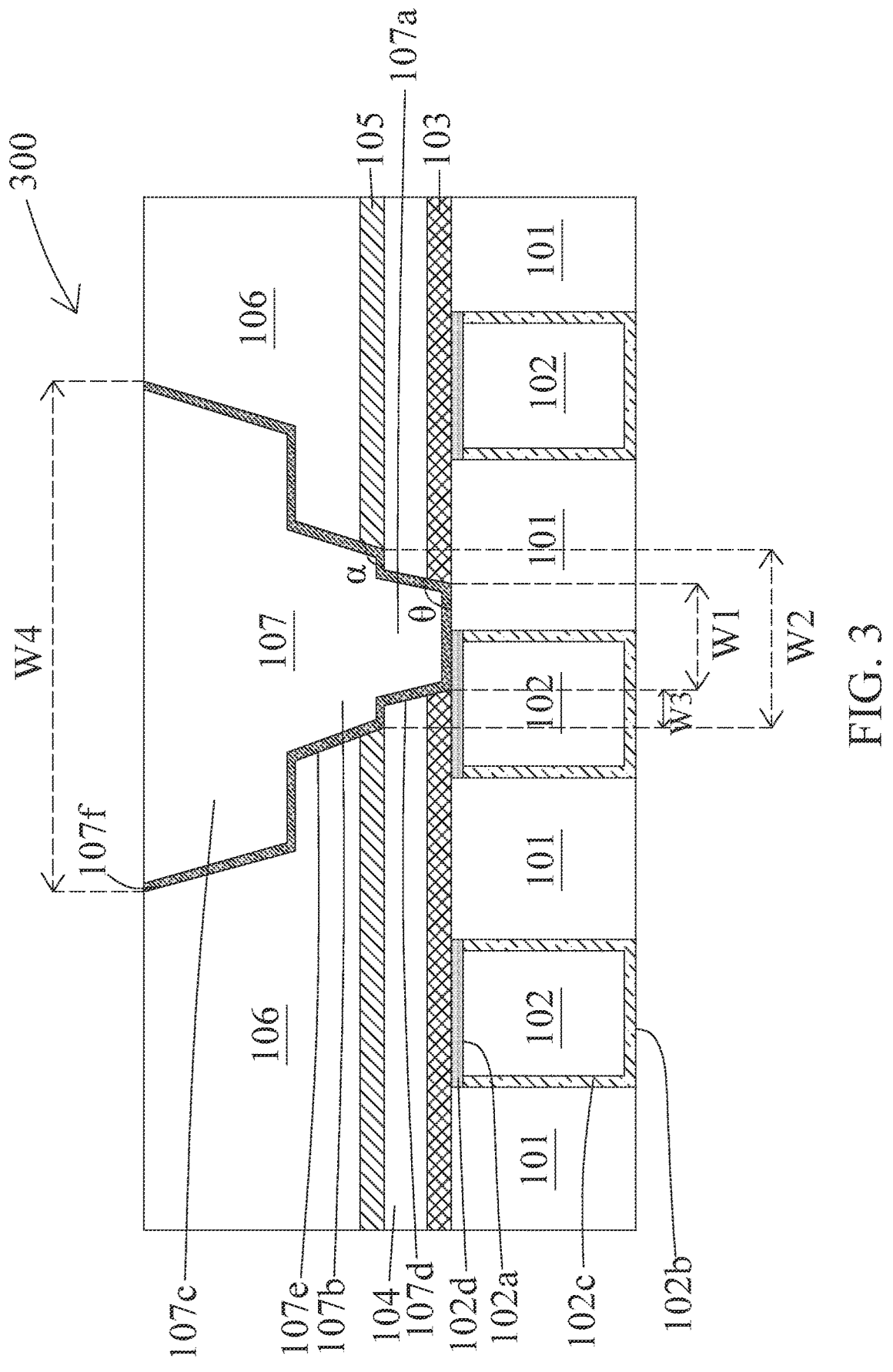
FIG. 3 is a schematic cross sectional view of a semiconductor structure in accordance with some embodiments of the present disclosure.

In some embodiments as shown in FIG. 3, the second portion 107b of the second conductive member 107 is tapered towards the first portion 107a of the second conductive member 107. In some embodiments, the first portion 107 of the second conductive member 107 is tapered towards the first conductive member 102. In some embodiments, a first angle θ of the third surface 107d relative to the first surface 102a of the first conductive member 102 is about 90° to about 160°. In some embodiments, a second angle α of the fourth surface 107e relative to the first surface 102a of the first conductive member 102 is about 90° to about 160°. In some embodiments, the first angle θ is substantially the same as the second angle α. In some embodiments, the third surface 107d of the first portion 107a and the fourth surface 107e of the second portion 107b are tilted surfaces. In some embodiments, the second angle α is substantially greater than the first angle θ. In some embodiments, the third surface 107d is a vertical surface and the fourth surface 107e is a tilted surface.

Figure 4:
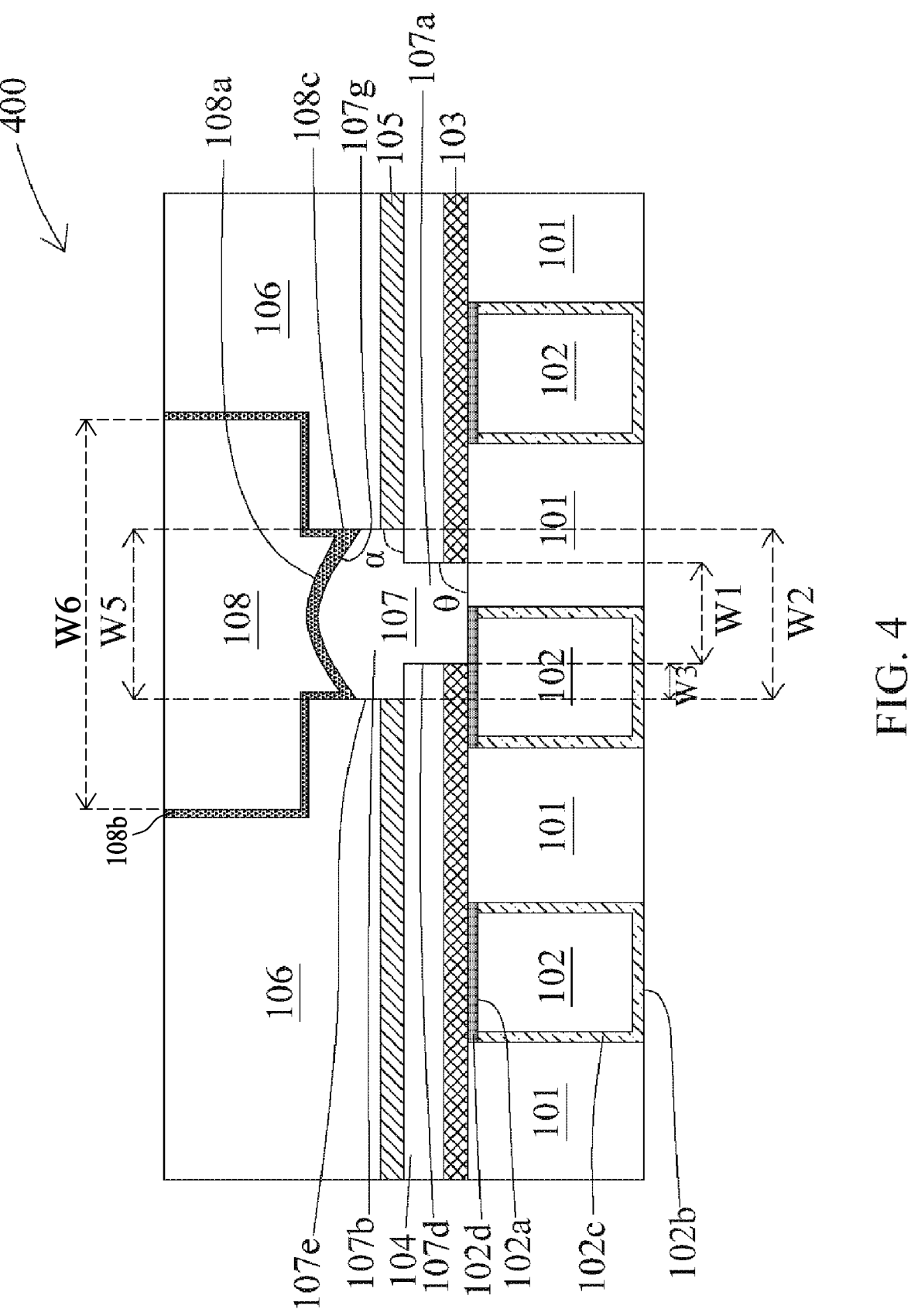
FIG. 4 is a schematic cross sectional view of a semiconductor structure in accordance with some embodiments of the present disclosure.

In some embodiments as shown in FIG. 4, a third conductive member 108 is disposed over the second conductive member 107. In some embodiments, the third conductive member 108 is surrounded by the third dielectric layer 106. In some embodiments, the second portion 107b of the second conductive member 107 is protruded into the third conductive member 108. In some embodiments, the second portion 107b includes a dome shaped contour. In some embodiments, the second portion 107b includes a convex surface 107g curving towards the third conductive member 108. In some embodiments, the convex surface 107g is surrounded by the third dielectric layer 106. In some embodiments, the third conductive member 108 includes a concave surface 108a curving away from the second conductive member 107. In some embodiments, a curved interface is disposed between the second portion 107b of the second conductive member 107 and the third conductive member 108.

In some embodiments, the third conductive member 108 includes a fifth width W5 and a sixth width W6. In some embodiments, the fifth width W5 is a shortest width of the third conductive member 108. In some embodiments, the sixth width W6 is a longest width of the third conductive member 108. In some embodiments, the fifth width W5 is substantially less than the sixth width W6. In some embodiments, the third conductive member 108 includes conductive material such as copper (Cu), aluminum (Al), cobalt (Co), titanium (Ti), tungsten (W), ruthenium (Ru), molybdenum (Mo), iridium (Ir), rhodium (Rh) or the like.

In some embodiments, the second portion 107b of the second conductive member 107 is tapered towards the first portion 107a of the second conductive member 107. In some embodiments, the third conductive member 108 is tapered towards the second conductive member 107. In some embodiments, the third conductive member 108 includes a fifth surface 108c interfacing with the third dielectric layer 106. In some embodiments, the fourth surface 107 is substantially parallel to the fifth surface 108c. In some embodiments, the fourth surface 107e of the second portion 107b and the fifth surface 108c of the third conductive member 108 are tilted surfaces. In some embodiments, the fourth surface 107e and the fifth surface 108c have substantially the same gradient.

In some embodiments, the third conductive member 108 includes a third barrier layer 120. In some embodiments, the third barrier layer 120 is a diffusion barrier layer. In some embodiments, the third barrier layer 120 is configured to prevent diffusion from the third conductive member 108 to the third dielectric layer 106 and provide adhesion between the third conductive member 108 and the third dielectric layer 106. In some embodiments, the third barrier layer 120 is disposed over the second portion 107b of the second conductive member 107. In some embodiments, the second conductive member 107 is separated from the third conductive member 108 by the third barrier layer 108. In some embodiments, the third barrier layer 120 is disposed between the third conductive member 108 and the third dielectric layer 106. In some embodiments, the third barrier layer 120 is disposed between the third conductive member 108 and the second conductive member 107. In some embodiments, the third barrier layer 120 includes tungsten (W), titanium (Ti), aluminum (Al), copper (Cu), tantalum (Ta) or the like.

In the present disclosure, a method of manufacturing a semiconductor structure is also disclosed. In some embodiments, a semiconductor structure 100, 200 or 300 is formed by a method 500. The method 500 includes a number of operations and the description and illustration are not deemed as a limitation as the sequence of the operations. FIG. 5 is an embodiment of the method 500 of manufacturing the semiconductor structure 100, 200 or 300. The method 500 includes a number of operations (501, 502, 503, 504, 505, 506, 507, 508, 509, 510 and 511).

In operation 501, a first dielectric layer 101 and a first conductive member 102 are provided as shown in FIG. 6. In some embodiments, the first conductive member 102 is surrounded by the first dielectric layer 101. In some embodiments, the first conductive member 102 is extended through the first dielectric layer 101. In some embodiments, the first conductive member 102 includes a first surface 102a and a second surface 102b opposite to the first surface 102a.

In some embodiments, the first dielectric layer 101 is formed by spin coating, chemical vapor deposition (CVD), plasma enhanced CVD (PECVD) or any other suitable operations. In some embodiments, the first conductive member 102 is formed by removing a portion of the first dielectric layer 101 to form a hole and disposing a conductive material into the hole. In some embodiments, the removal of the portion of the first dielectric layer 101 includes photolithography, etching or any other suitable operations. In some embodiments, the disposing of the conductive material includes sputtering, electroplating or any other suitable operations.

In some embodiments, a substrate is provided before the disposing of the first dielectric layer 101 and the first conductive member 102. In some embodiments, the first dielectric layer 101 and the first conductive member 102 are disposed over the substrate. In some embodiments, the substrate is configured to support components of the semiconductor structure during the method 500. The components of the semiconductor structure are formed over the substrate during the method 500.

In some embodiments, a first barrier layer 102c is formed before the formation of the first conductive member 102. In some embodiments, the first barrier layer 102c surrounds the first conductive member 102. In some embodiments, the first barrier layer 102c is disposed conformal to the hole of the first dielectric layer 101, and then the first conductive member 102 is disposed over the first barrier layer 102c. In some embodiments, the first barrier layer 102c is disposed by deposition, electroless plating or any other suitable operations.

In some embodiments, a capping layer 102d is formed over the first conductive member 102 and the first barrier layer 102c. In some embodiments, the capping layer 102d is surrounded by the first dielectric layer 101. In some embodiments, the capping layer 102d is formed by CVD, sputtering or any other suitable operations. In some embodiments, the first dielectric layer 101, the first conductive member 102, the first barrier layer 102c and the capping layer 102d are in configurations as described above or shown in FIGS. 1-4.

In operation 502, a first protective layer 103 is disposed over the first dielectric layer 101 and the first conductive member 102 as shown in FIG. 7. In some embodiments, the first protective layer 103 is disposed over the capping layer 102d. In some embodiments, the first protective layer 103 is an etch stop layer configured to stop etching operations. In some embodiments, the first protective layer 103 is formed by CVD, PECVD or any other suitable operations. In some embodiments, the first protective layer 103 is in configuration as described above or shown in FIGS. 1-4.

In operation 503, a second dielectric layer 104 is disposed over the first protective layer 103 as shown in FIG. 8. In some embodiments, the second dielectric layer 104 is disposed conformal to the first protective layer 103. In some embodiments, the second dielectric layer 104 is formed by spin coating, CVD, PECVD or any other suitable operations. In some embodiments, the second dielectric layer 104 is in configuration as described above or shown in FIGS. 1-4.

Figures 9, 10:
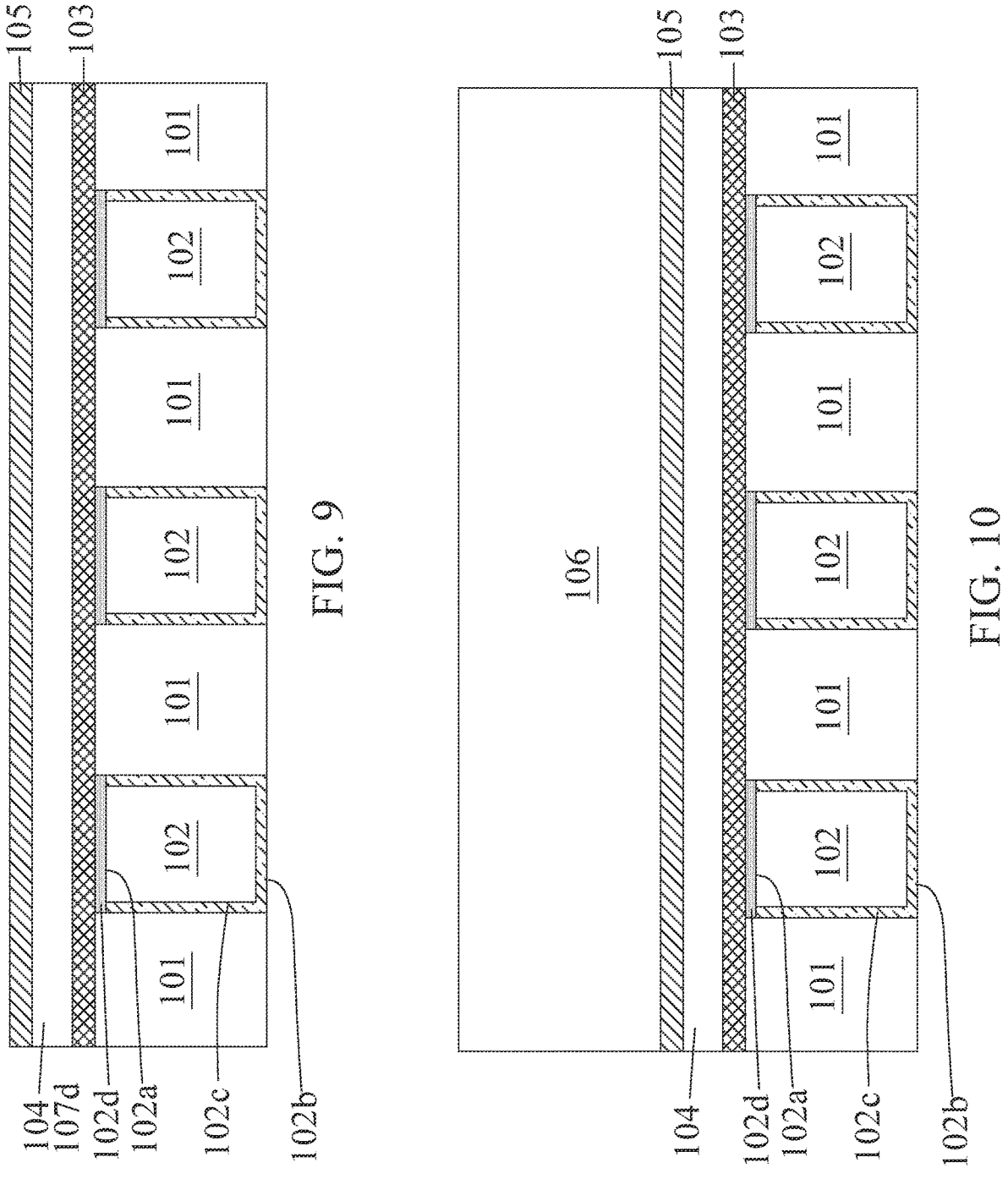

In operation 504, a second protective layer 105 is disposed over the second dielectric layer 104 as shown in FIG. 9. In some embodiments, the second protective layer 105 is disposed conformal to the second dielectric layer 104. In some embodiments, the second protective layer 105 is an etch stop layer configured to stop etching operations. In some embodiments, the second protective layer 105 is formed by CVD, PECVD or any other suitable operations. In some embodiments, the second protective layer 105 is in configuration as described above or shown in FIGS. 1-4.

In operation 505, a third dielectric layer 106 is disposed over the second protective layer 105 as shown in FIG. 10. In some embodiments, the third dielectric layer 106 is formed by spin coating, CVD, PECVD or any other suitable operations. In some embodiments, the third dielectric layer 106 is in configuration as described above or shown in FIGS. 1-4.

Figure 11:
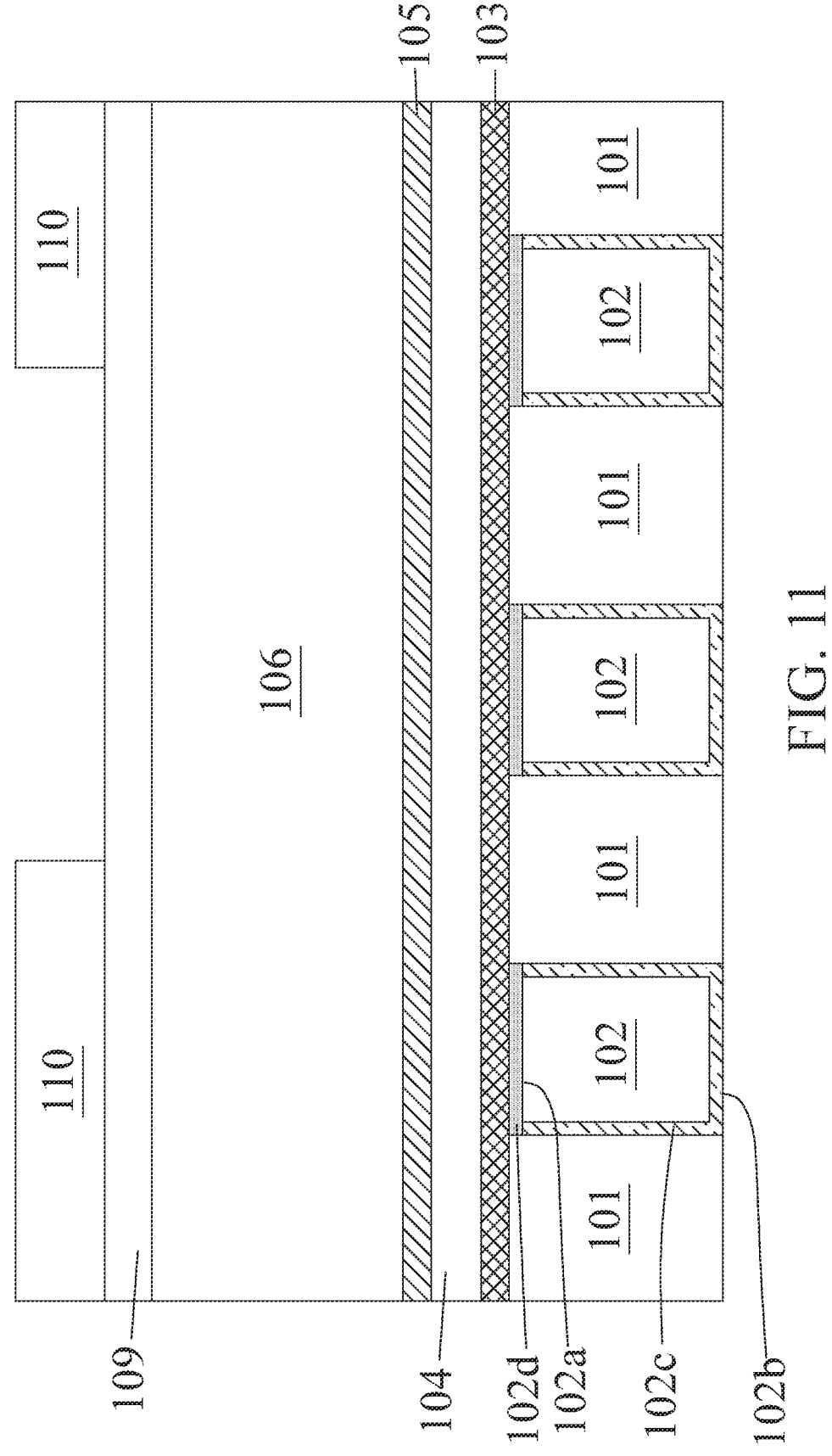

In some embodiments, a dielectric mask 109 is disposed over the third dielectric layer 106, and a hard mask 110 is formed over the dielectric mask 109 as shown in FIG. 11. In some embodiments, the dielectric mask 109 is configured to protect the third dielectric layer 106 from removal. In some embodiments, the dielectric mask 109 includes silicon oxide or any other suitable materials. In some embodiments, the dielectric mask 109 is formed by CVD or any other suitable operations.

In some embodiments, a portion of the hard mask 110 is removed to pattern the hard mask 110. In some embodiments, the hard mask 110 is patterned by disposing a first photoresist over the hard mask 110, patterning the first photoresist and removing the portion of the hard mask 110 exposed from the patterned first photoresist. In some embodiments, the first photoresist is disposed by spin coating or any other suitable operations. In some embodiments, the first photoresist is patterned by exposing a portion of the first photoresist from a photomask, projecting a predetermined electromagnetic radiation towards the photomask and the exposed portion of the first photoresist, and removing the exposed portion of the first photoresist. In some embodiments, the patterned hard mask 110 is formed as shown in FIG. 11. In some embodiments, the dielectric mask 109 covers the third dielectric layer 106 after the patterning of the hard mask 110. In some embodiments, the first photoresist is removed after the patterning of the hard mask 110. In some embodiments, the first photoresist is removed by wet etching, stripping or any other suitable operations.

Figure 12:
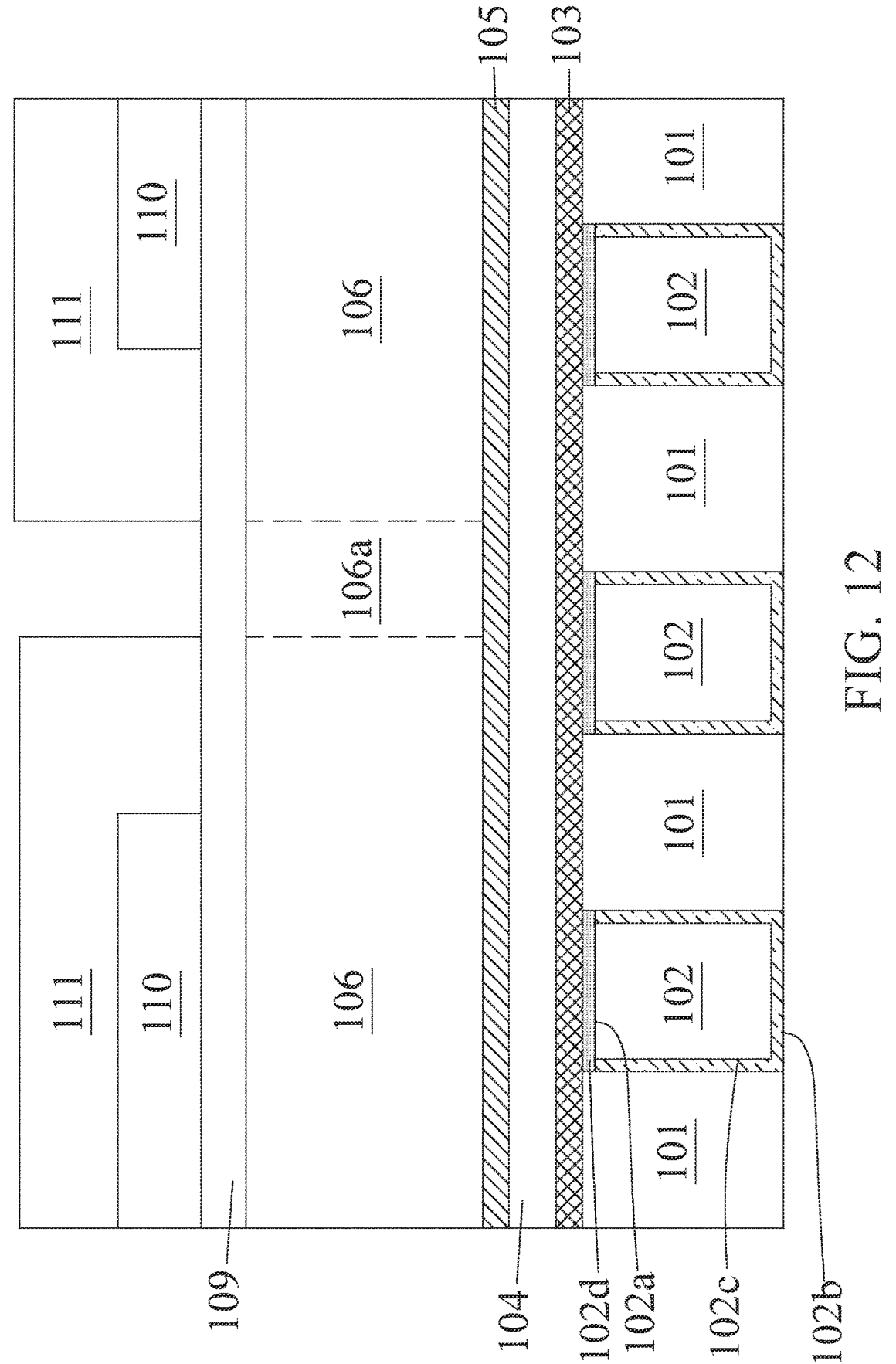
Figure 13:
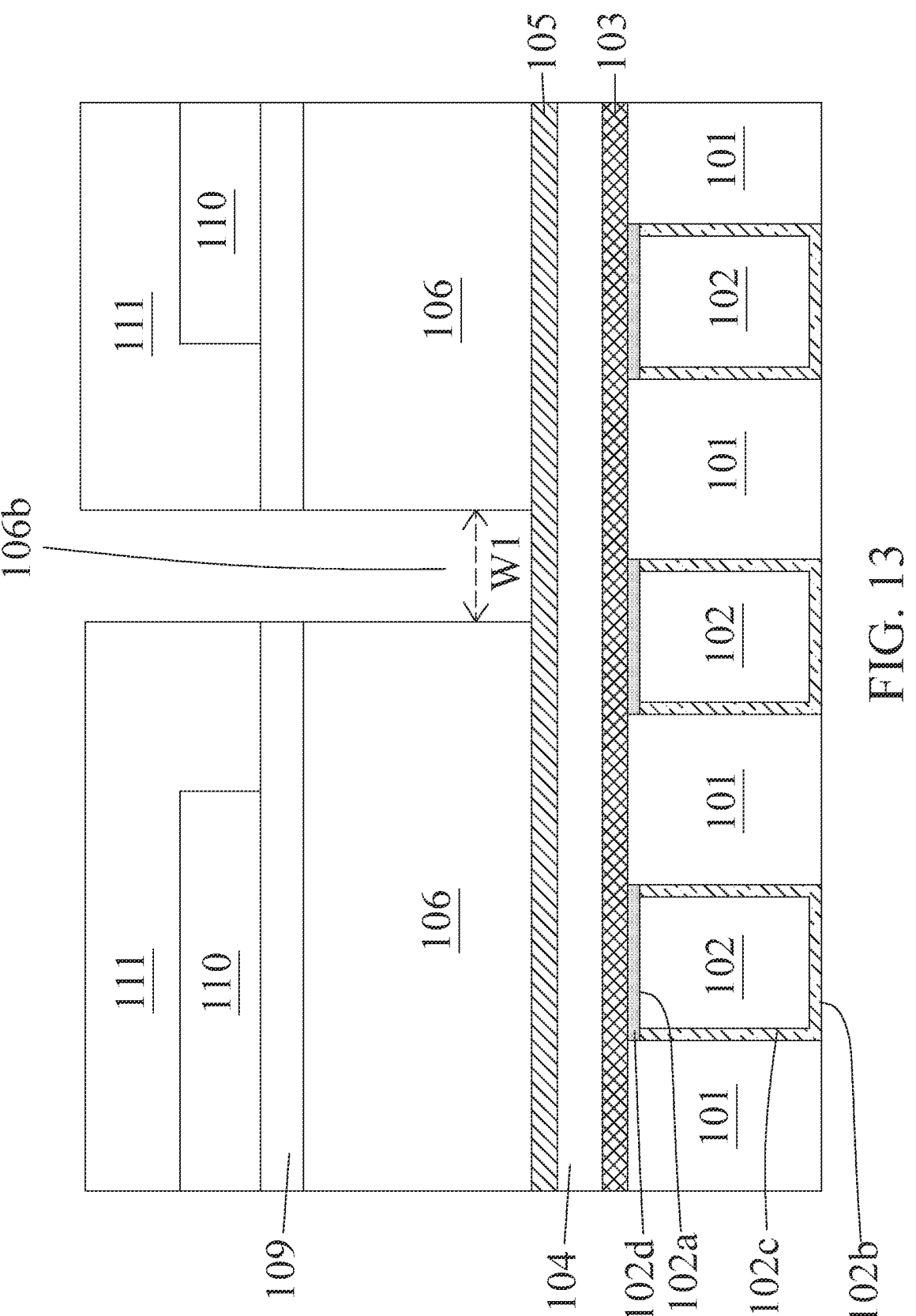
Figure 14:
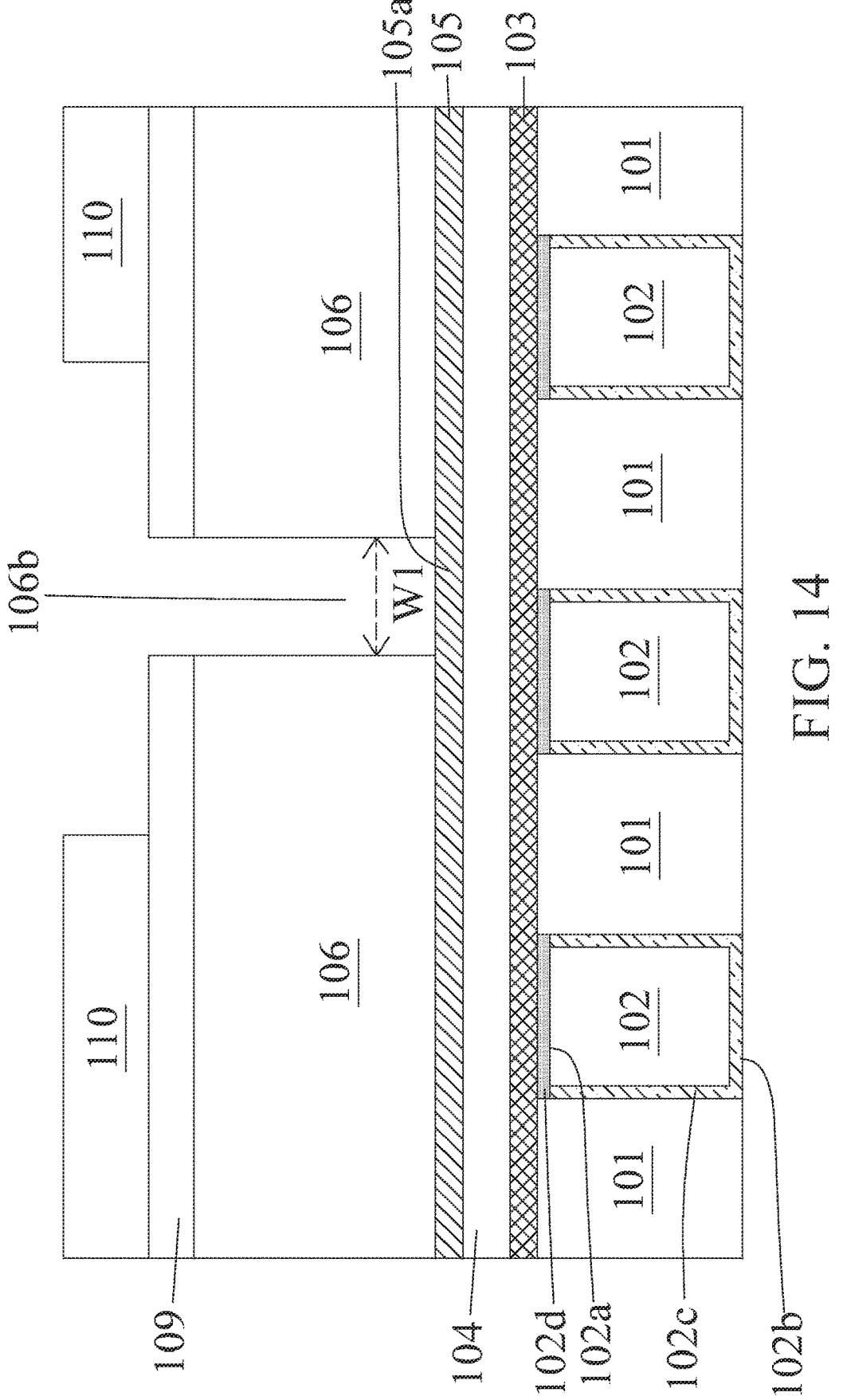

In operation 506, a first portion 106a of the third dielectric layer 106 is removed to form a first opening 106b as shown in FIGS. 12-14. In some embodiments, a second photoresist 111 is disposed over the hard mask 110 and the dielectric mask 109. In some embodiments, the second photoresist 111 is disposed by spin coating or any other suitable operations. In some embodiments, the second photoresist 111 is patterned by exposing a portion of the second photoresist 111 from a photomask, projecting a predetermined electromagnetic radiation towards the photomask and the exposed portion of the second photoresist 111, and removing the exposed portion of the second photoresist 111. In some embodiments, a patterned second photoresist 111 is formed as shown in FIG. 12.

In some embodiments, a portion of the dielectric mask 109 is exposed from the patterned second photoresist 111. In some embodiments, the exposed portion of the dielectric mask 109 and the first portion 106a of the third dielectric layer 106 under the exposed portion of the dielectric mask 109 are removed as shown in FIG. 13. In some embodiments, the exposed portion of the dielectric mask 109 and the first portion 106a of the third dielectric layer 106 are removed by dry etching or any other suitable operations. In some embodiments, the first opening 106b is formed after the removal of the first portion 106a of the third dielectric layer 106. In some embodiments, the first opening 106b is extended through the third dielectric layer 106.

In some embodiments, a first width W1 the first opening 106b is about 10 Å to about 300 Å. In some embodiments, the first opening 106b is not aligned with the first conductive member 102 as shown in FIG. 13. In some embodiments, the first opening 106b is disposed above and aligned with the first conductive member 102. In some embodiments, a first portion 105a of the second protective layer 105 is exposed after the formation of the first opening 106b. In some embodiments, the second photoresist 111 is removed after the formation of the first opening 106b as shown in FIG. 14. In some embodiments, the second photoresist 111 is removed by wet etching, stripping or any other suitable operations.

Figure 15:
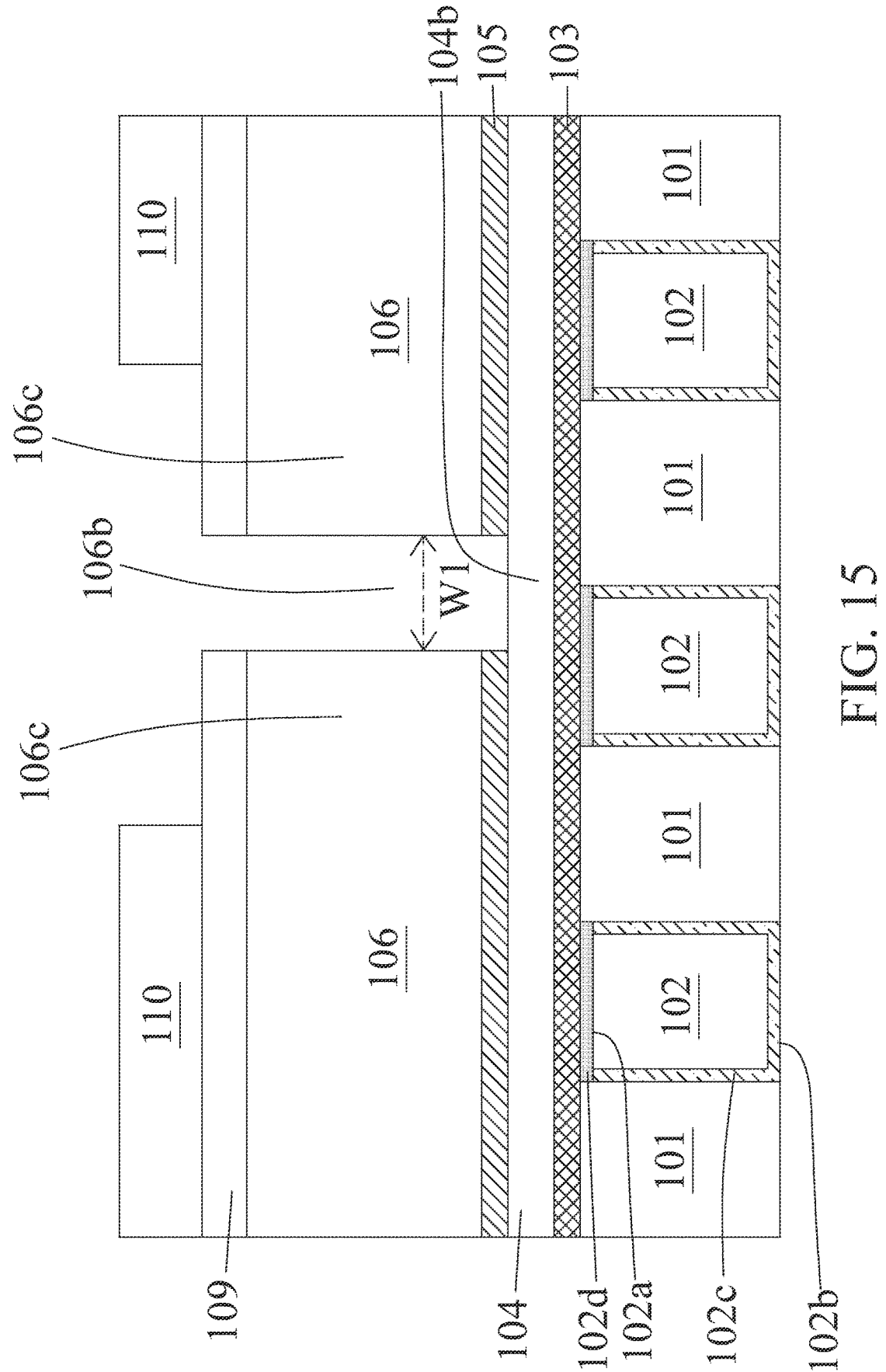

In operation 507, the first portion 105a of the second protective layer 105 exposed by the first opening 106b is removed as shown in FIG. 15. In some embodiments, the first portion 105a of the second protective layer 105 is removed by wet etching or any other suitable operations. In some embodiments, a first portion 104b of the second dielectric layer 104 is exposed from the second protective layer 105 after the removal of the first portion 105a of the second protective layer 105. In some embodiments, a second portion 106c of the third dielectric layer 106 is uncovered by the hard mask 110.

Figure 16:
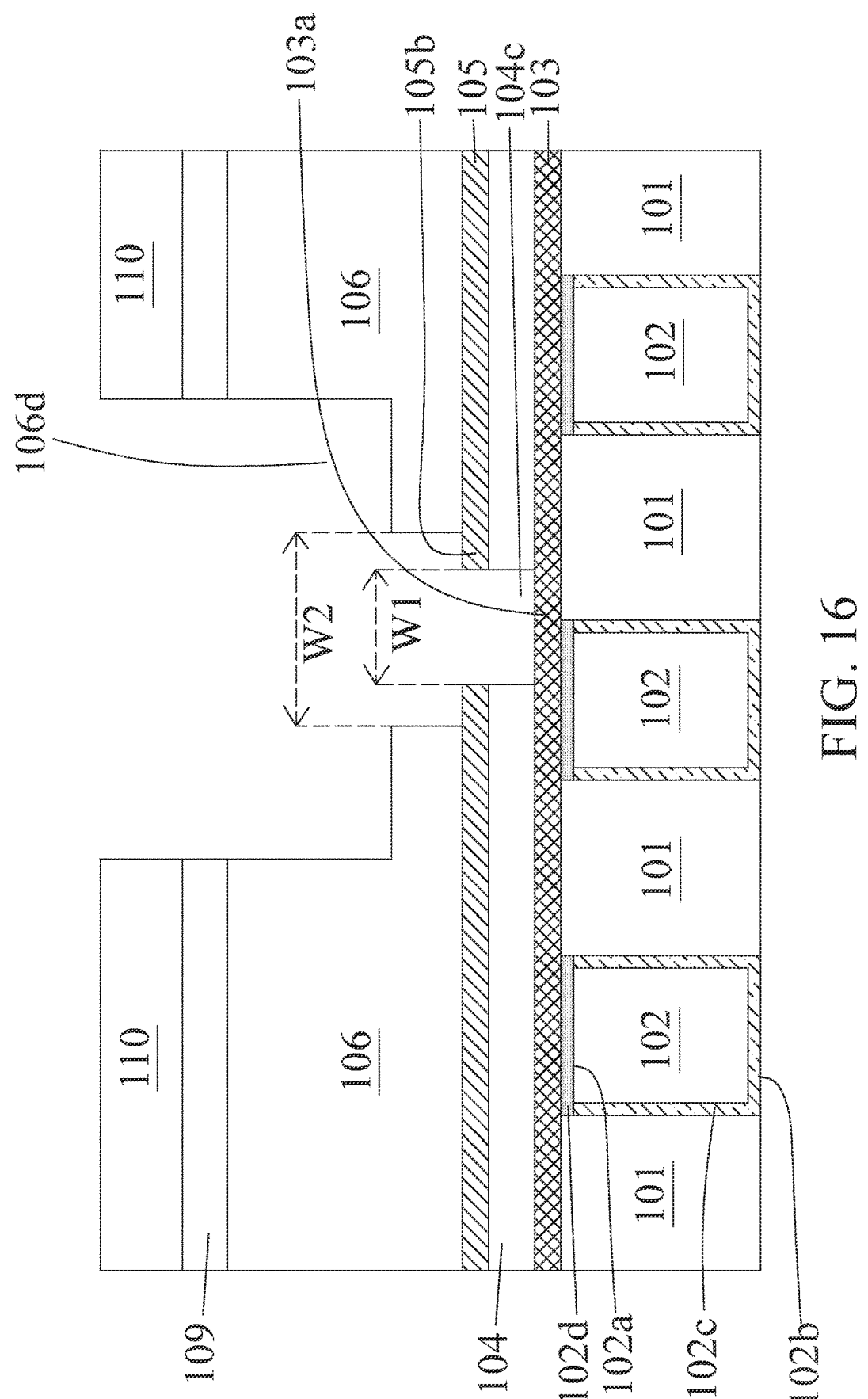

In operation 508, the second portion 106c of the third dielectric layer 106 is removed to form a second opening 106d as shown in FIG. 16. In some embodiments, the second portion 106c of the third dielectric layer 106 is removed by dry etching or any other suitable operations. In some embodiments, more of the third dielectric layer 106 adjacent to the hard mask 109 is etched compared with the third dielectric layer 106 away from the hard mask 109 and close to the first dielectric layer 101. As such, the second opening 106d has a step contour after the removal of the second portion 106c of the third dielectric layer 106. In some embodiments, the second opening 106d is tapered towards the first conductive member 102 and the second dielectric layer 104. In some embodiments, a second portion 105b of the second protective layer 105 is exposed by the second opening 106d after the removal of the second portion 106c of the third dielectric layer 106. In some embodiments, the dielectric mask 109 uncovered by the hard mask 110 is removed before or upon the removal of the second portion 106c of the third dielectric layer 106.

In operation 509, the first portion 104b of the second dielectric layer 104 exposed from the second protective layer 105 is removed to form a third opening 104c as shown in FIG. 16. In some embodiments, the first portion 104b of the second dielectric layer 104 is removed by dry etching or any other suitable operations. In some embodiments, a portion 103a of the first protective layer 103 is exposed by the third opening 104c after removal of the first portion 104b of the second dielectric layer 104.

In some embodiments, the second portion 106c of the third dielectric layer 106 and the first portion 104b of the second dielectric layer 104 are removed separately or simultaneously. In some embodiments, the operation 508 and the operation 509 are performed separately or simultaneously. In some embodiments, a width of the third opening 104c is substantially the same as the first width W1 of the first opening 106b. In some embodiments, a second width W2 of the second opening 106d is substantially greater than the width of the third opening 104c. In some embodiments, the second opening 106d is tapered towards the third opening 104c.

Figure 17:
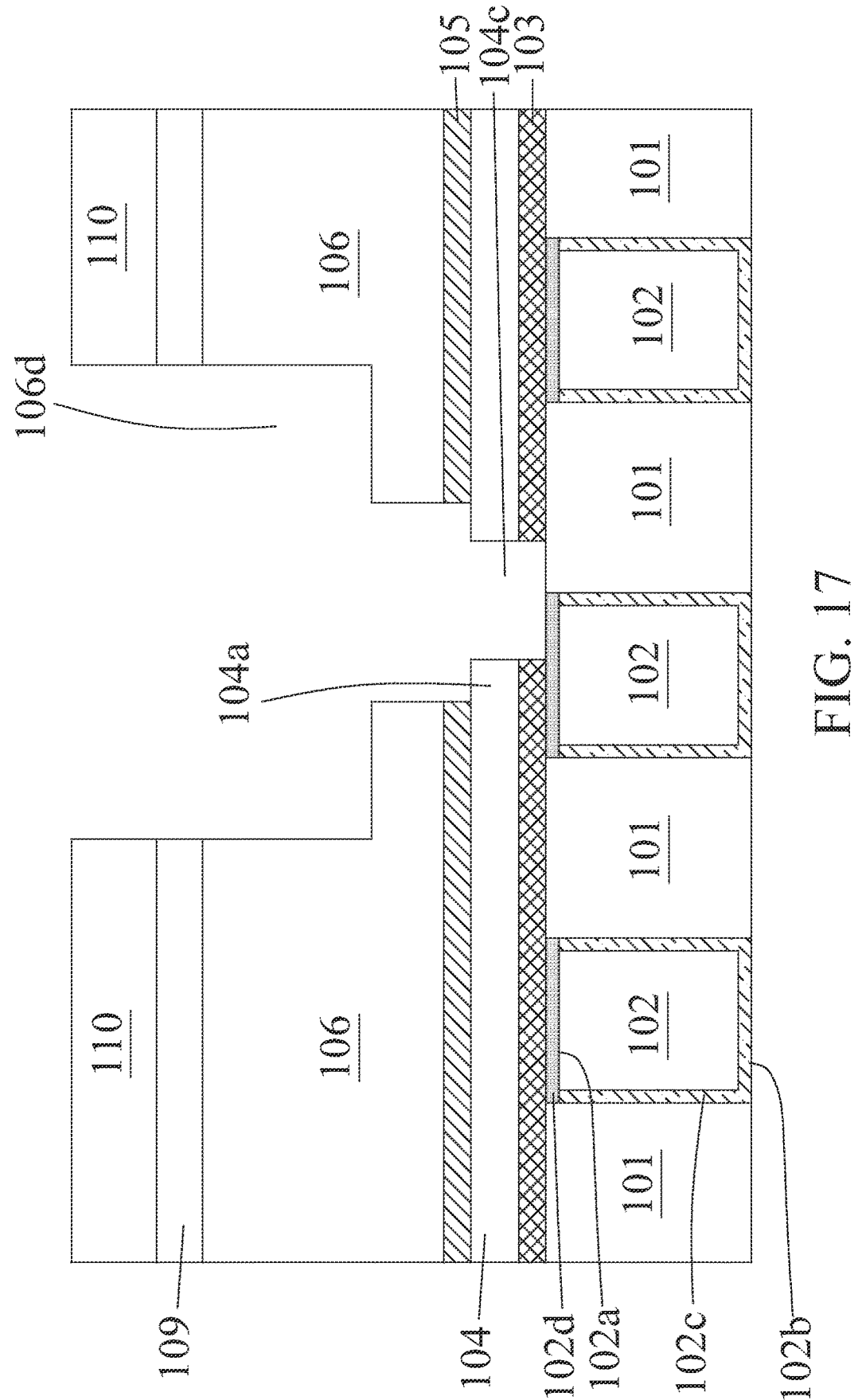

In operation 510, the portion 103a of the first protective layer 103 exposed by the third opening 104c and a second portion 105b of the second protective layer 105 exposed by the second opening 106d are removed as shown in FIG. 17. In some embodiments, the portion 103a of the first protective layer 103 and the second portion 105b of the second protective layer 105 are removed by wet etching or any other suitable operations. In some embodiments, the removal of the portion 103a of the first protective layer 103 and the removal of the second portion 105b of the second protective layer 105 are performed separately or simultaneously. In some embodiments, a portion 104a of the second dielectric layer 104 is exposed by the second opening 106d after the removal of the second portion 105b of the second protective layer 105. In some embodiments, the portion 104a of the second dielectric layer 104 is laterally protruded. In some embodiments, the first conductive member 102 or the capping layer 102d is exposed after the removal of the portion 103a of the first protective layer 103.

Figure 18:
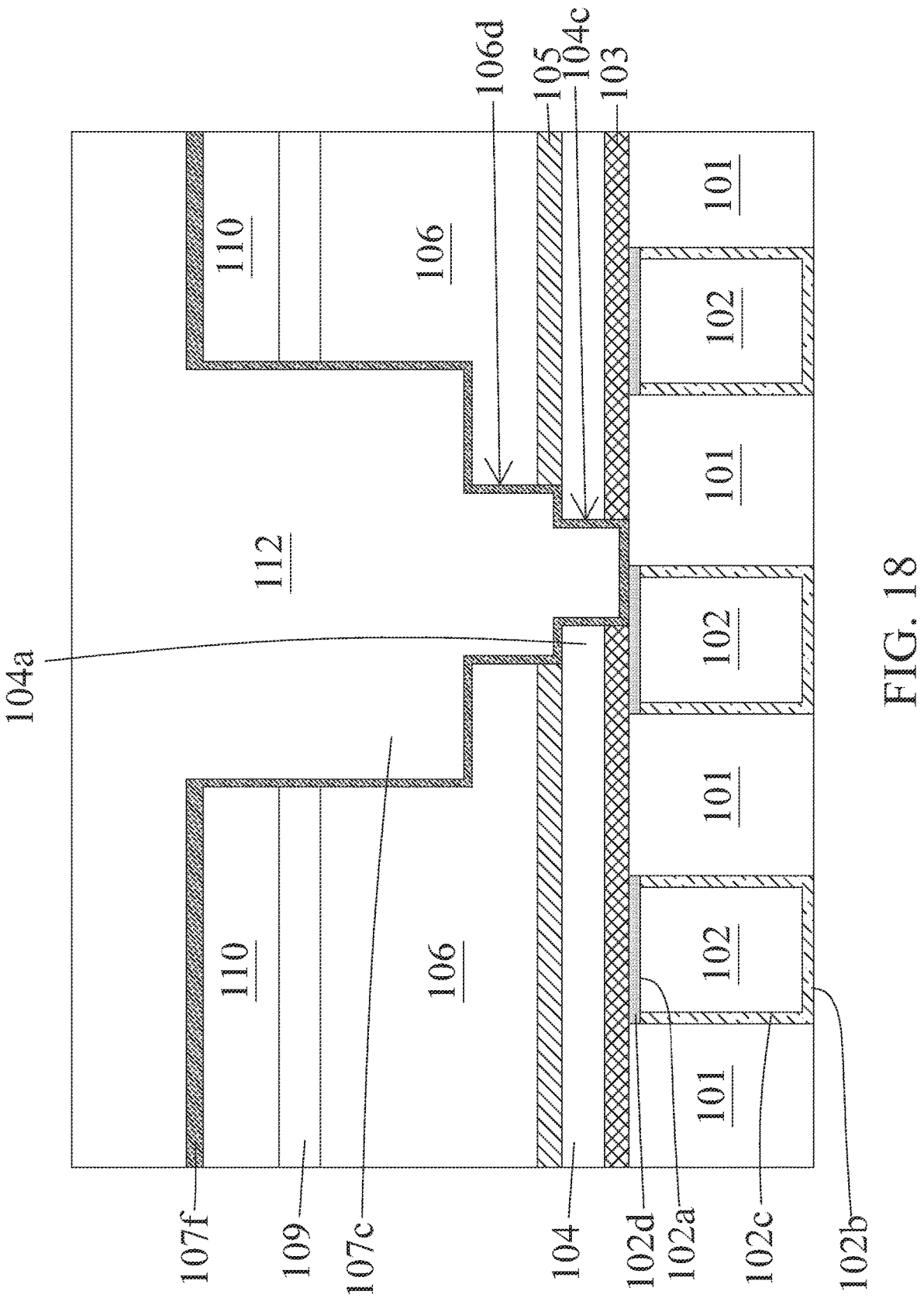
Figure 19:
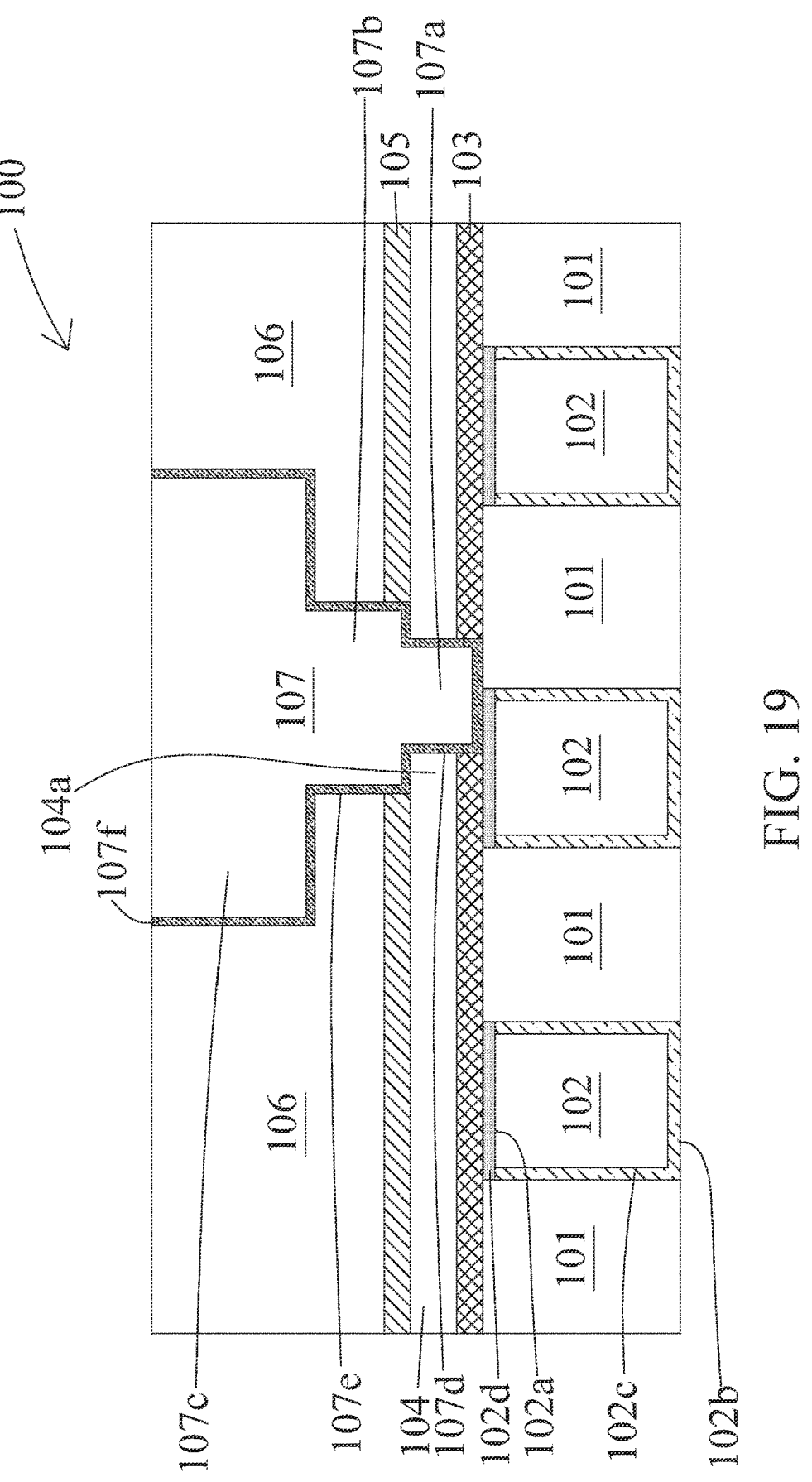

In operation 511, a conductive material 112 is disposed into the second opening 106d and the third opening 104c to form a second conductive member 107 as shown in FIGS. 18-19. In some embodiments, the conductive material 112 is disposed over the third dielectric layer 106. In some embodiments, the conductive material 112 is disposed over the dielectric mask 109 and the hard mask 110. In some embodiments, the conductive material 112 is formed by sputtering, electroplating, CVD, physical vapor deposition (PVD) or any other suitable operations.

In some embodiments, a second barrier layer 107f is disposed conformal to the second opening 106d and the third opening 104c before the disposing of the conductive material 112. In some embodiments, the second barrier layer 107f is formed, and then the conductive material 112 is disposed over the second barrier layer 107f. In some embodiments, the second barrier layer 107f is disposed over the third dielectric layer 106. In some embodiments, the second barrier layer 107f is disposed over the dielectric mask 109 and the hard mask 110. In some embodiments, the second barrier layer 107f is disposed by sputtering, electroplating, CVD, physical vapor deposition (PVD) or any other suitable operations.

In some embodiments, the second conductive member 107 is formed after planarization of the conductive material 112. In some embodiments as shown in FIG. 19, some of the conductive material 112 are removed to form the second conductive member 107. In some embodiments, some of the second barrier layer 107f disposed over the third dielectric layer 106, some of the conductive material 112 disposed over the third dielectric layer 106, the dielectric mask 109 and the hard mask 110 are removed by chemical mechanical planarization (CMP) or any other suitable operations. In some embodiments, the second conductive member 107 is in configurations as described above or shown in FIGS. 1-3. In some embodiments, a semiconductor structure 100 described above and shown in FIG. 1 is formed. In some embodiments, a semiconductor structure 200 having the second conductive member 107 aligned with the first conductive member 102 as described above or shown in FIG. 2 is formed. In some embodiments, a semiconductor structure 300 having tapered second conductive member 107 as described above or shown in FIG. 3 is formed.

In the present disclosure, a method of manufacturing a semiconductor structure is also disclosed. In some embodiments, a semiconductor structure is formed by a method 600. The method 600 includes a number of operations and the description and illustration are not deemed as a limitation as the sequence of the operations. FIG. 20 is an embodiment of the method 600 of manufacturing a semiconductor structure. The method 600 includes a number of operations (601, 602, 603, 604, 605, 606, 607, 608, 609, 610, 611 and 612).

In operation 601, a first dielectric layer 101 and a first conductive member 102 are provided as shown in FIG. 6. The operation 601 is substantially the same as the operation 501.

In operation 602, a first protective layer 103 is disposed over the first dielectric layer 101 and the first conductive member 102 as shown in FIG. 7. The operation 602 is substantially the same as the operation 502.

In operation 603, a second dielectric layer 104 is disposed over the first protective layer 103 as shown in FIG. 8. The operation 603 is substantially the same as the operation 503.

In operation 604, a second protective layer 105 is disposed over the second dielectric layer 104 as shown in FIG. 9. The operation 604 is substantially the same as the operation 504.

In operation 605, a third dielectric layer 106 is disposed over the second protective layer 105 as shown in FIG. 10. The operation 605 is substantially the same as the operation 505. In some embodiments, a hard mask 110 is formed over the third dielectric layer 106 as shown in FIG. 11.

In operation 606, a first portion 106*a* of the third dielectric layer 106 is removed to form a first opening 106*b* as shown in FIGS. 12-14. The operation 606 is substantially the same as the operation 506.

In operation 607, the first portion 105*a* of the second protective layer 105 exposed by the first opening 106*b* is removed as shown in FIG. 15. The operation 607 is substantially the same as the operation 507.

In operation 608, the second portion 106*c* of the third dielectric layer 106 is removed to form a second opening 106*d* as shown in FIG. 16. The operation 608 is substantially the same as the operation 508.

In operation 609, the first portion 104*b* of the second dielectric layer 104 exposed from the second protective layer 105 is removed to form a third opening 104*c* as shown in FIG. 16. The operation 609 is substantially the same as the operation 509.

In operation 610, the portion 103*a* of the first protective layer 103 exposed by the third opening 104*c* and a second portion 105*b* of the second protective layer 105 exposed by the second opening 106*d* are removed as shown in FIG. 17.

Figure 21:
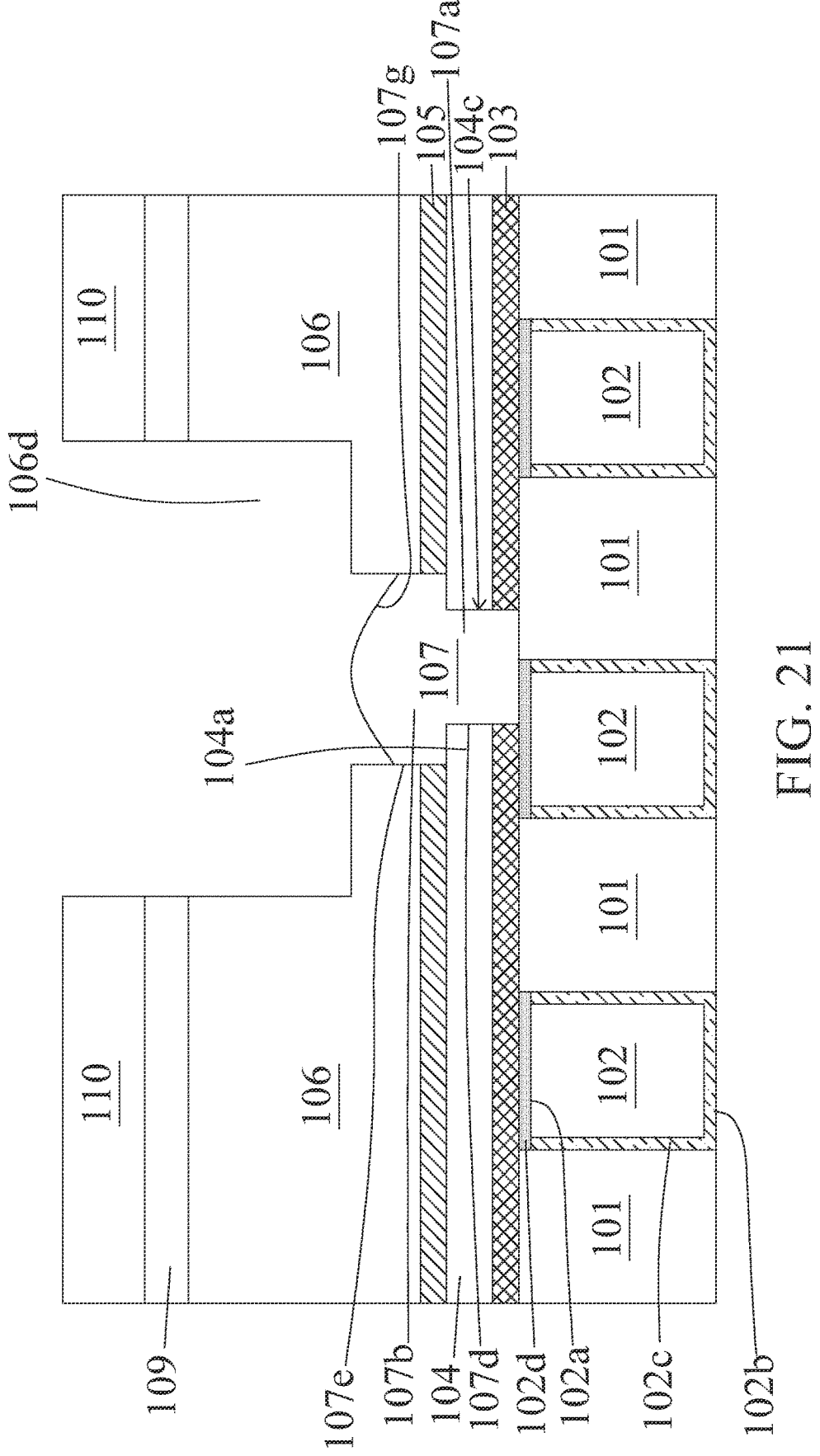

In operation 611, a first conductive material is disposed to form a second conductive member 107 as shown in FIG. 21. In some embodiments, the first conductive material is disposed into the second opening 106*d* and the third opening 104*c* to form the second conductive member 107. In some embodiments, the first conductive material is disposed by electroless plating, CVD or any other suitable operations. In some embodiments, the first conductive material is grown within the third opening 104*c* and a portion of the second opening 106*d* to form the second conductive member 107. In some embodiments, the second conductive member 107 is surrounded by the first protective layer 103, the second dielectric layer 104, the second protective layer 105 and the third dielectric layer 106. In some embodiments, the first conductive material is grown to form the second conductive member 107 having a step contour.

In some embodiments, the second conductive member 107 includes a first portion 107*a* and a second portion 107*b* over the first portion 107*a*. In some embodiments, the first portion 107*a* is surrounded by the first protective layer 103 and the second dielectric layer 104. In some embodiments, the second portion 107*b* is surrounded by the second protective layer 105 and the third dielectric layer 106. In some embodiments, the first conductive material is grown to form the second portion 107*b* of the second conductive member 107 having a dome shaped contour. In some embodiments, the second portion 107*b* includes a convex surface 107*g* curving towards the second opening 106*d*. In some embodiments, the first portion 107*a* includes a third surface 107*d* interfacing with the first protective layer 103 and the second dielectric layer 104. In some embodiments, the second portion 107*b* includes a fourth surface 107*e* interfacing with the second protective layer 105 and the third dielectric layer 106. In some embodiments, the third surface 107*d* is substantially parallel to the fourth surface 107*e*. In some embodiments, the fourth surface 107*e* is tapered towards the first conductive member 102. In some embodiments, the second conductive member 107 is in configuration as described above or shown in FIG. 4.

Figure 22:
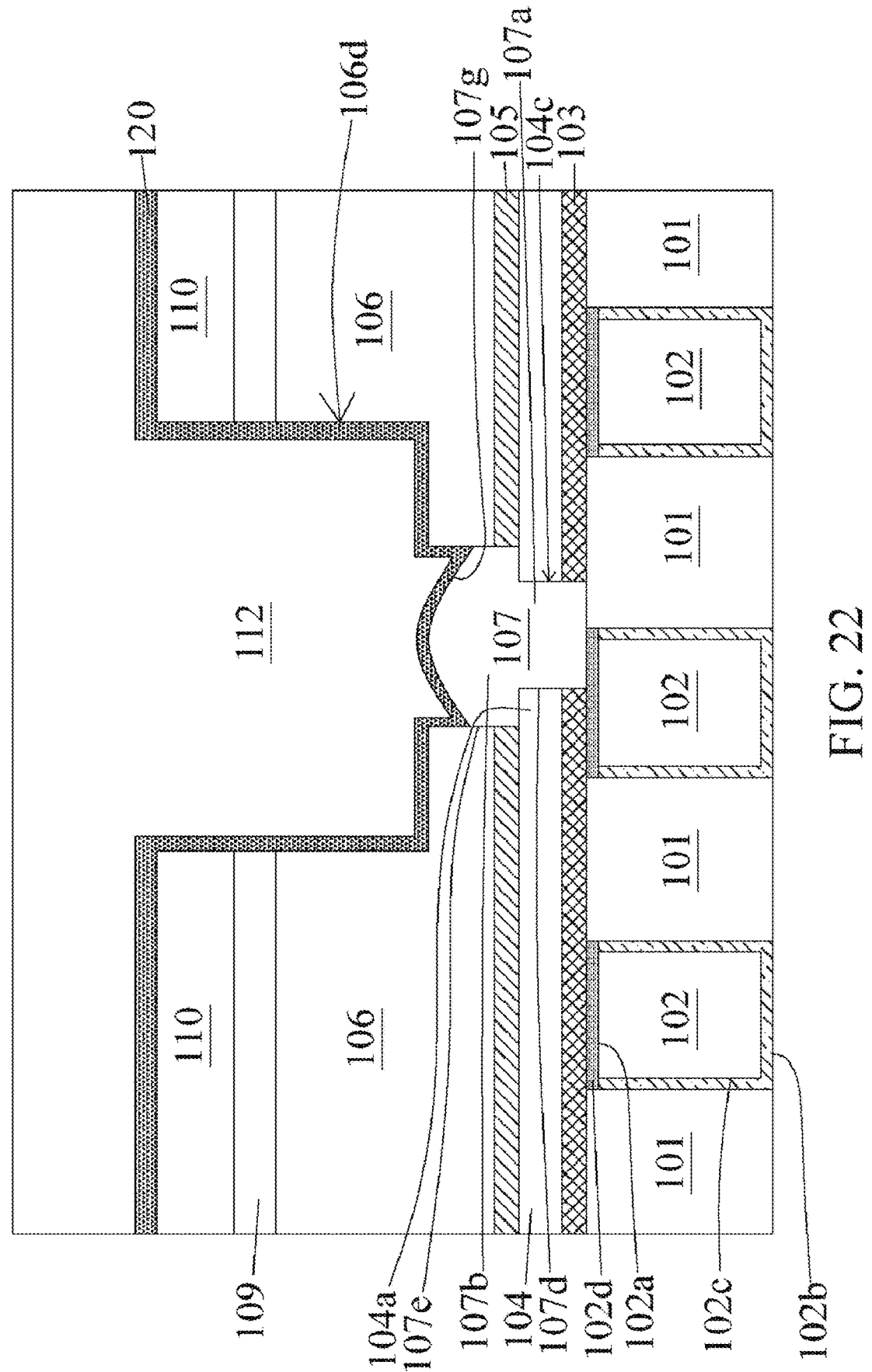
Figure 23:
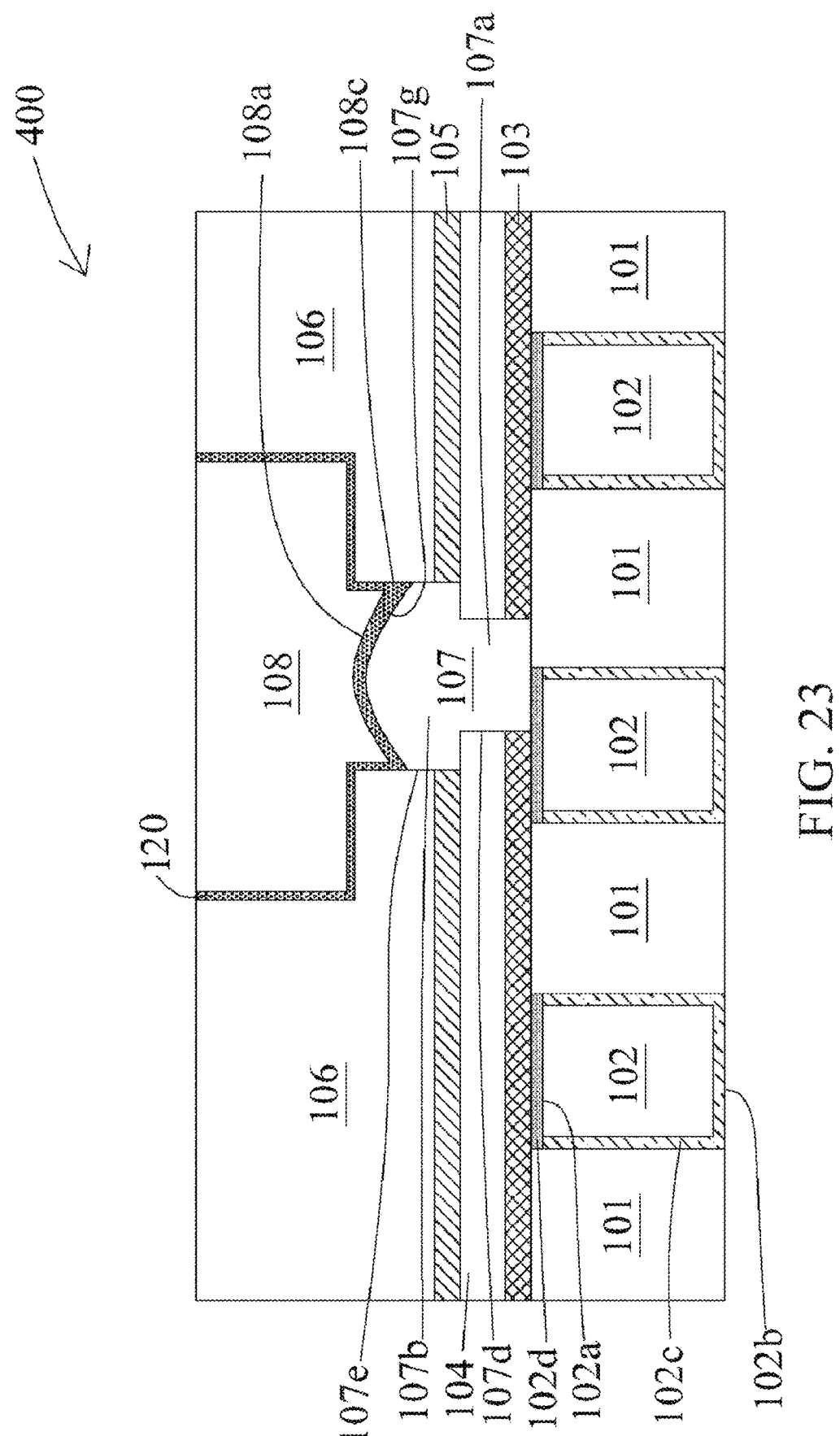

In operation 612, a second conductive material 112 is disposed to form a third conductive member 108 as shown in FIGS. 22-23. The second conductive member 107 and the third conductive member 108 are separately formed. In some embodiments, the second conductive material 112 is disposed into the second opening 106*d* and over the third dielectric layer 106. In some embodiments, the second conductive material 112 is disposed over the dielectric mask 109 and the hard mask 110. In some embodiments, the second conductive material 112 is formed by sputtering, electroplating, CVD, physical vapor deposition (PVD) or any other suitable operations. In some embodiments, the third conductive member 108 includes a concave surface 108*a* curving away from the second conductive member 107.

In some embodiments, a third barrier layer 120 is disposed conformal to the convex surface 107*g* of the second conductive member 107 and the second opening 106*d* before the disposing of the second conductive material 112. In some embodiments, the third barrier layer 120 is formed, and then the second conductive material 112 is disposed over the second barrier layer 107*f*. In some embodiments, the third barrier layer 120 is disposed over the third dielectric layer 106. In some embodiments, the third barrier layer 120 is disposed over the dielectric mask 109 and the hard mask 110. In some embodiments, the third barrier layer 120 is disposed by sputtering, electroplating, CVD, physical vapor deposition (PVD) or any other suitable operations. Since an interface between the second conductive member 107 and the third conductive member 108 or between the second conductive member 107 and the third barrier layer 120 is curved, a contacting surface between the second conductive member 107 and the third conductive member 108 or between the second conductive member 107 and the third barrier layer 120 is increased. As such, adhesion between the second conductive member 107 and the third conductive member 108 or between the second conductive member 107 and the third barrier layer 120 is improved.

In some embodiments, the third conductive member 108 is formed after planarization of the second conductive material 112. In some embodiments as shown in FIG. 23, some of the second conductive material 112 are removed to form the third conductive member 108. In some embodiments, some of the third barrier layer 120 disposed over the third dielectric layer 106, some of the second conductive material 112 disposed over the third dielectric layer 106, the dielectric mask 109 and the hard mask 110 are removed by chemical mechanical planarization (CMP) or any other suitable operations. In some embodiments, the third conductive member 108 is in configurations as described above or shown in FIG. 4. In some embodiments, a semiconductor structure 400 described above and shown in FIG. 4 is formed.

In some embodiments, a semiconductor structure includes a first conductive member extended through and laterally surrounded by a first dielectric layer; a second conductive member disposed over the first dielectric layer and the first conductive member, and laterally surrounded by a second dielectric layer; and a third conductive member disposed over the second conductive member, and laterally surrounded by the second dielectric layer, wherein a portion of the second conductive member is protruded into the third conductive member.

In some embodiments, a semiconductor structure includes a first conductive member extended through a first dielectric layer; a first protective layer disposed over the first dielectric layer and the first conductive member; a second dielectric layer disposed over the first protective layer; a second protective layer disposed over the second dielectric layer; a third dielectric layer disposed over the second dielectric layer; a second conductive member disposed over the first dielectric layer and the first conductive member, and laterally surrounded by the first protective layer, the second dielectric layer, the second protective layer and the third dielectric layer; and a third conductive member disposed over the second conductive member and laterally surrounded by the third dielectric layer, wherein the second conductive member includes a first portion and a second portion disposed over and coupled with the first portion, the first portion is extended through and laterally surrounded by the first protective layer and the second dielectric layer, and the second portion is laterally surrounded by the third dielectric layer.

In some embodiments, a method of manufacturing a semiconductor structure includes providing a first dielectric layer and a first conductive member surrounded by the first dielectric layer; disposing a first protective layer over the first dielectric layer and the first conductive member; disposing a second dielectric layer over the first protective layer; disposing a second protective layer over the second dielectric layer; disposing a third dielectric layer over the second protective layer; removing a first portion of the third dielectric layer to form a first opening; removing a first portion of the second protective layer exposed by the first opening; removing a second portion of the third dielectric layer to form a second opening; removing a first portion of the second dielectric layer exposed from the second protective layer to form a third opening; removing a portion of the first protective layer exposed by the third opening and a second portion of the second protective layer exposed by the second opening; and disposing a conductive material into the second opening and the third opening to form a second conductive member.

In some embodiments, a first width of the first opening is substantially less than a second width of the second opening, and the first width is substantially the same as a third width of the third opening. In some embodiments, a second portion of the second dielectric layer is exposed by the second opening after the removal of the second portion of the second protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first conductive member extended through and laterally surrounded by a first dielectric layer;
   a second conductive member disposed over the first dielectric layer and the first conductive member, wherein the second conductive member comprises a first portion and a second portion over and coupled to the first portion, a width of the first portion of the second conductive member extends an entire distance from a first sidewall of the second dielectric layer to a second sidewall of the second dielectric layer, a width of the second portion of the second conductive member extends an entire distance from a first sidewall of the third dielectric layer to a second sidewall of the third dielectric layer, the width of the second portion of the second conductive member is greater than the width of the first portion of the second conductive member, the first portion of the second conductive member is laterally surrounded by a second dielectric layer, the second portion of the second conductive member is laterally surrounded by a third dielectric layer, and a bottom surface of the second portion of the second conductive member is in direct contact with second dielectric layer;

a third conductive member disposed over the second conductive member, and laterally surrounded by the third dielectric layer, wherein the third conductive member comprises a barrier layer, a first portion over the barrier layer, and a second portion over and coupled to the first portion of the third conductive member, the second portion of the second conductive member is protruded into the third conductive member; and a protective layer between the second dielectric layer and the third dielectric layer, wherein the barrier layer of the third conductive member is in direct contact with the first portion of the third conductive member and the second portion of the second conductive member, wherein the barrier layer has a dome shaped contour, and a lowest part of the dome shaped contour is higher than and separated from a top surface of the protective layer by a distance, wherein a combined width of the barrier layer and the second portion of the third conductive member is greater than a combined width of the barrier layer and the first portion of the third conductive member, and the width of the first portion of the second conductive member and the width of the second portion of the second conductive member are less than the combined width of the barrier layer and the second portion of the third conductive member, wherein the third conductive member has a first bottom surface and a second bottom surface, and the first bottom surface is at a level higher than a level of the second bottom surface, and wherein a top surface of the second portion of the second conductive member is at a level lower than that of the first bottom surface and lower than that of the second bottom surface of the third conductive member, and wherein the bottom surface of the second portion of the second conductive member is at a level lower than a level of the top surface of the protective layer.

2. The semiconductor structure of claim 1, wherein the width of the second portion of the second conductive member is equal to the combined width of the barrier layer and the first portion of the third conductive member.

3. The semiconductor structure of claim 1, wherein sidewalls of the first portion of the second conductive member are in contact with the second dielectric layer.

4. The semiconductor structure of claim 1, wherein the second portion of the second conductive member and the first portion of the second conductive member form a first step configuration.

5. The semiconductor structure of claim 4, wherein the second portion of the third conductive member and the first portion of the third conductive member form a second step configuration.

6. The semiconductor structure of claim 1, wherein a portion of sidewalls of the second portion of the second conductive member is in contact with the third dielectric layer.

7. A semiconductor structure, comprising:

a first conductive member extended through a first dielectric layer;

a first protective layer disposed over the first dielectric layer and the first conductive member;

a second dielectric layer disposed over the first protective layer;

a second protective layer disposed over the second dielectric layer;

a third dielectric layer disposed over the second dielectric layer;

a second conductive member disposed over the first dielectric layer and the first conductive member, and laterally surrounded by the first protective layer, the second dielectric layer, the second protective layer and the third dielectric layer; and a third conductive member disposed over the second conductive member and laterally surrounded by the third dielectric layer, wherein the second conductive member includes a first portion and a second portion disposed over and coupled with the first portion of the second conductive member, a width of the first portion of the second conductive member extends an entire distance from a first sidewall of the second dielectric layer to a second sidewall of the second dielectric layer, a width of the second portion of the second conductive member extends an entire distance from a first sidewall of the third dielectric layer to a second sidewall of the third dielectric layer, the width of the second portion of the second conductive member is greater than the width of the first portion of the second conductive member, the first portion of the second conductive member is extended through and laterally surrounded by the first protective layer and the second dielectric layer, the second portion of the second conductive member is laterally surrounded by the second protective layer and the third dielectric layer, a bottom surface of the second portion of the second conductive member is at a level lower than a level of a top surface of the second protective layer, and the bottom surface of the second portion of the second conductive member is in direct contact with the second dielectric layer, wherein the third conductive member comprises a barrier layer, a first portion over the barrier layer, and a second portion over and coupled to the first portion of the third conductive member, the barrier layer is in direct contact with the second portion of the second conductive member and the first portion of the third conductive member, and wherein the barrier layer has a dome shaped contour, and a lowest part of the dome shaped contour is higher than and separated from a bottom surface of the third dielectric layer by a distance.

8. The semiconductor structure of claim 7, wherein the barrier layer comprises:

a first surface in direct contact with the second portion of the second conductive member; and a second surface opposite to the first surface, and in direct contact with the first portion of the third conductive member.

9. The semiconductor structure of claim 7, wherein the second portion of the second conductive member includes a convex surface curving towards the third conductive member.

10. The semiconductor structure of claim 7, wherein the second portion of the second conductive member is protruded from the first portion of the second conductive member in a length of 3 Å to about 150 Å.

11. The semiconductor structure of claim 7, wherein the second portion of the second conductive member and the first portion of the second conductive member form a first step configuration.

12. The semiconductor structure of claim 11, wherein the second portion of the third conductive member and the first portion of the third conductive member form has a second step configuration.

13. The semiconductor structure of claim 7, wherein the second portion of the second conductive member directly contacts the third dielectric layer.

14. The semiconductor structure of claim 7, wherein at least a portion of the second dielectric layer is disposed between the first protective layer and the second portion of the second conductive member.

15. The semiconductor structure of claim 7, further comprising:

a capping layer disposed over the first conductive member.

16. A semiconductor structure, comprising:

a first conductive member;

a second conductive member disposed over the first conductive member and laterally surrounded by a protective layer and a dielectric layer, wherein the second conductive member comprises a first portion and a second portion over and coupled to the first portion, a width of the first portion of the second conductive member extends an entire distance from a first sidewall of the dielectric layer to a second sidewall of the dielectric layer, a width of the second portion of the second conductive member extends an entire distance from a first sidewall of the protective layer to a second sidewall of the protective layer, and the width of the second portion is greater than the width of the first portion;

a third conductive member disposed over the second conductive member, wherein the third conductive member comprises a barrier layer, a first portion over the barrier layer, and a second portion over and coupled to the first portion of the third conductive member, the second portion of the second conductive member is protruded into the first portion of the third conductive member; and wherein the barrier layer is in direct contact with the second portion of the second conductive member and the first portion of the third conductive member, the barrier layer has a dome shaped contour, and a lowest part of the dome shaped contour is higher than and separated from a top surface of the first protective layer by a distance, wherein the dome shaped contour of the barrier layer curves away from the second conductive member, and a material of the barrier layer is different from materials of the first conductive member, the second conductive member and the third conductive member, and wherein the barrier layer is separated from the first portion of the second conductive member by the second portion of the second conductive member, wherein a width of the third conductive member is greater than the width of the first portion of the second conductive member and is greater than the width of the second portion of the second conductive member.

17. The semiconductor structure of claim 16, further comprising:

a first dielectric layer laterally surrounding the first conductive member;

the dielectric layer is a second dielectric layer laterally surrounding the first portion of the second conductive member; and a third dielectric layer laterally surrounding the third conductive member and the second portion of the second conductive member.

18. The semiconductor structure of claim 17, further comprising:

a first protective layer between the first dielectric layer and the second dielectric layer, and between the first conductive member and the second dielectric layer, the protective layer is a second protective layer which laterally surrounds the second portion of the second conductive member.

19. The semiconductor structure of Claim 2, wherein the second portion of the third conductive member and the first portion of the third conductive member form a step configuration, and the second portion of the second conductive member and the first portion of the second conductive member form a step configuration.

20. The semiconductor structure of claim 17, wherein the barrier layer is separated from the first dielectric layer.

* * * * *